(12) United States Patent
Sewell et al.

(10) Patent No.: US 8,859,322 B2
(45) Date of Patent: Oct. 14, 2014

(54) CELL AND MODULE PROCESSING OF SEMICONDUCTOR WAFERS FOR BACK-CONTACTED SOLAR PHOTOVOLTAIC MODULE

(71) Applicant: Renewable Energy Corporation ASA, Sandvika (NO)

(72) Inventors: Richard Hamilton Sewell, Los Altos, CA (US); Andreas Bentzen, Oslo (NO)

(73) Assignee: Rec Solar Pte. Ltd., Singapore (SG)

( * ) Notice: Subject to any disclaimer, the term of this patent is extended or adjusted under 35 U.S.C. 154(b) by 0 days.

(21) Appl. No.: 13/631,338

(22) Filed: Sep. 28, 2012

(65) Prior Publication Data
US 2013/0244371 A1    Sep. 19, 2013

Related U.S. Application Data

(60) Provisional application No. 61/612,724, filed on Mar. 19, 2012, provisional application No. 61/612,746, filed on Mar. 19, 2012, provisional application No. 61/612,769, filed on Mar. 19, 2012, provisional application No. 61/612,800, filed on Mar. 19, 2012.

(51) Int. Cl.
| | | |
|---|---|---|
| H01L 21/00 | (2006.01) | |
| H01L 31/18 | (2006.01) | |
| H01L 31/0224 | (2006.01) | |
| H01L 31/068 | (2012.01) | |
| H01L 31/05 | (2014.01) | |
| H01L 31/048 | (2014.01) | |

(52) U.S. Cl.
CPC ........... *H01L 31/1804* (2013.01); *Y02E 10/547* (2013.01); *H01L 31/022441* (2013.01); *H01L 31/0682* (2013.01); *H01L 31/0516* (2013.01); *H01L 31/0488* (2013.01)

USPC ........ 438/89; 438/98; 136/256; 257/E31.124; 257/E31.13

(58) Field of Classification Search
USPC ......... 438/89, 98, 66; 136/256; 257/E31.124, 257/E31.13
See application file for complete search history.

(56) References Cited

U.S. PATENT DOCUMENTS 6,337,283 B1    1/2002   Verlinden et al.
6,488,995 B1 *  12/2002  Nishimoto et al. ........... 427/574

(Continued)

FOREIGN PATENT DOCUMENTS

EP          2302692 A1       3/2011
WO     WO 2006/110048 A1   10/2006

(Continued)

OTHER PUBLICATIONS

Beaucarne et al., "Etching, texturing and surface decoupling for the next generation of Si solar cells", Photovoltaics International, PV101-10_3, 2008. pp. 66-71.

(Continued)

*Primary Examiner* — Julia Slutsker
(74) *Attorney, Agent, or Firm* — Birch, Stewart, Kolasch & Birch, LLP

(57) ABSTRACT

The present invention relates to cost effective production methods of high efficiency silicon based back-contacted back-junction solar panels and solar panels thereof having a multiplicity of alternating rectangular emitter- and base regions on the back-side of each cell, each with rectangular metallic electric finger conductor above and running in parallel with the corresponding emitter- and base region, a first insulation layer in-between the wafer and finger conductors, and a second insulation layer in between the finger conductors and cell interconnections.

20 Claims, 16 Drawing Sheets

(56) References Cited

U.S. PATENT DOCUMENTS

| | | | |
|---|---|---|---|
| 2003/0160251 A1* | 8/2003 | Wanlass et al. | 257/80 |
| 2011/0237066 A1* | 9/2011 | Sato et al. | 438/627 |
| 2011/0303280 A1 | 12/2011 | Pawlak et al. | |
| 2011/0315186 A1 | 12/2011 | Gee et al. | |
| 2012/0080508 A1* | 4/2012 | Schultz et al. | 228/179.1 |
| 2012/0305063 A1* | 12/2012 | Moslehi et al. | 136/256 |
| 2013/0056065 A1* | 3/2013 | Yin et al. | 136/256 |
| 2013/0069225 A1* | 3/2013 | Lin et al. | 257/737 |

FOREIGN PATENT DOCUMENTS

| | | |
|---|---|---|
| WO | WO 2008/039078 A2 | 4/2008 |
| WO | WO 2009/128721 A2 | 10/2009 |
| WO | WO 2010/025269 A1 | 3/2010 |
| WO | WO 2010/087718 A1 | 8/2010 |
| WO | WO 2011/031707 A1 | 3/2011 |

OTHER PUBLICATIONS

Keevers et. al, "10% Efficient CSG Minimodules", 22nd European Photovoltaic Solar Energy Conference, Milan, Sep. 2007. pp. 1783-1790.

Kumaravelu et al. "Surface Texturing for Silicon Cells Using Reactive Ion Etching", Photovoltaic Specialists Conference, 2002. Conference Record of the Twenty-Ninth IEEE, May 19-24, 2002. pp. 258-261.

Le Quang et al., "Dry Plasma Texturing—An Alternative Technique for Industrial Production of Thin mc-Si Solar Cells", paper presented at 22nd European PV SEC, Sep. 3-7, 2007 in Milan, Italy. pp. 1506-1510.

* cited by examiner

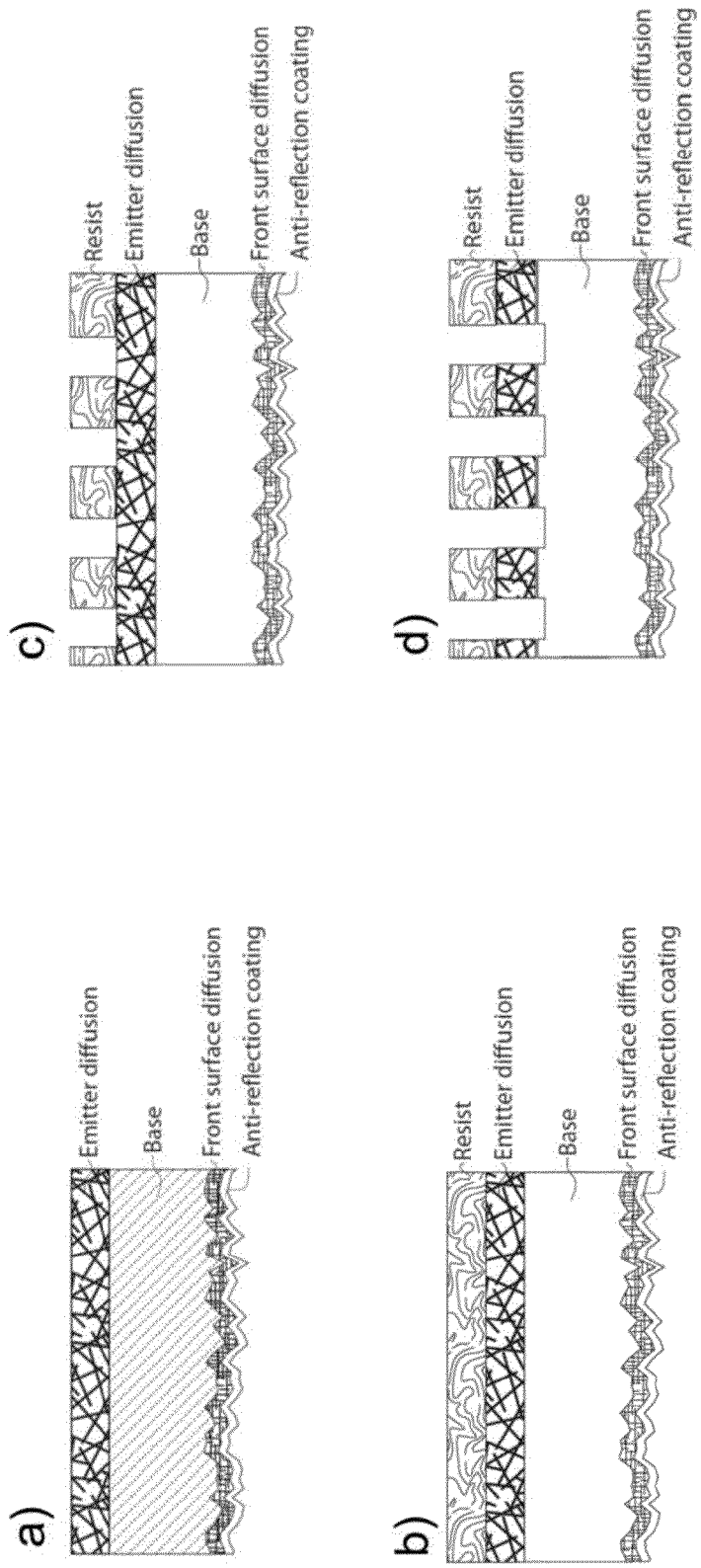
Figure 8 a) – d)

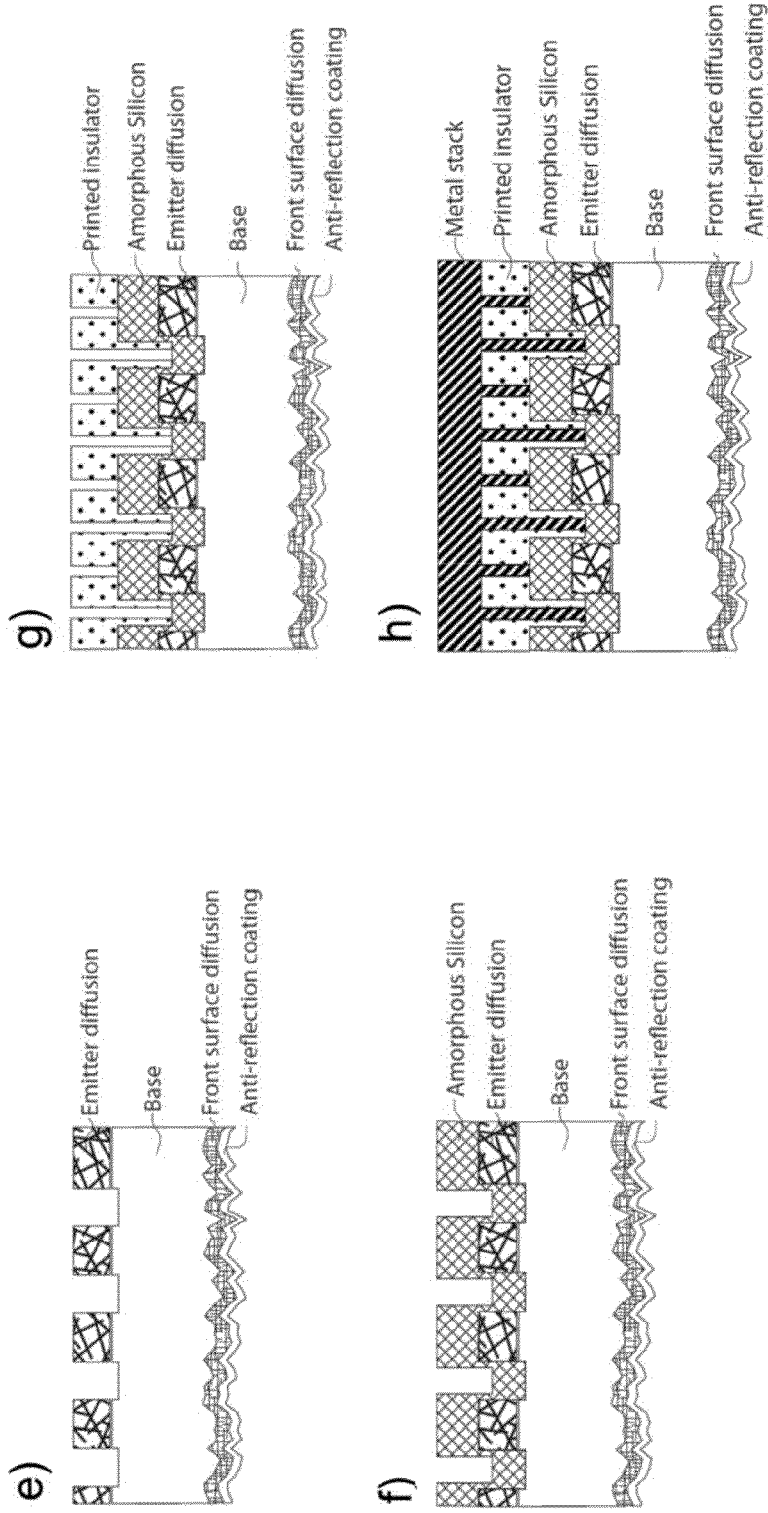
Figure 8 e) – h)

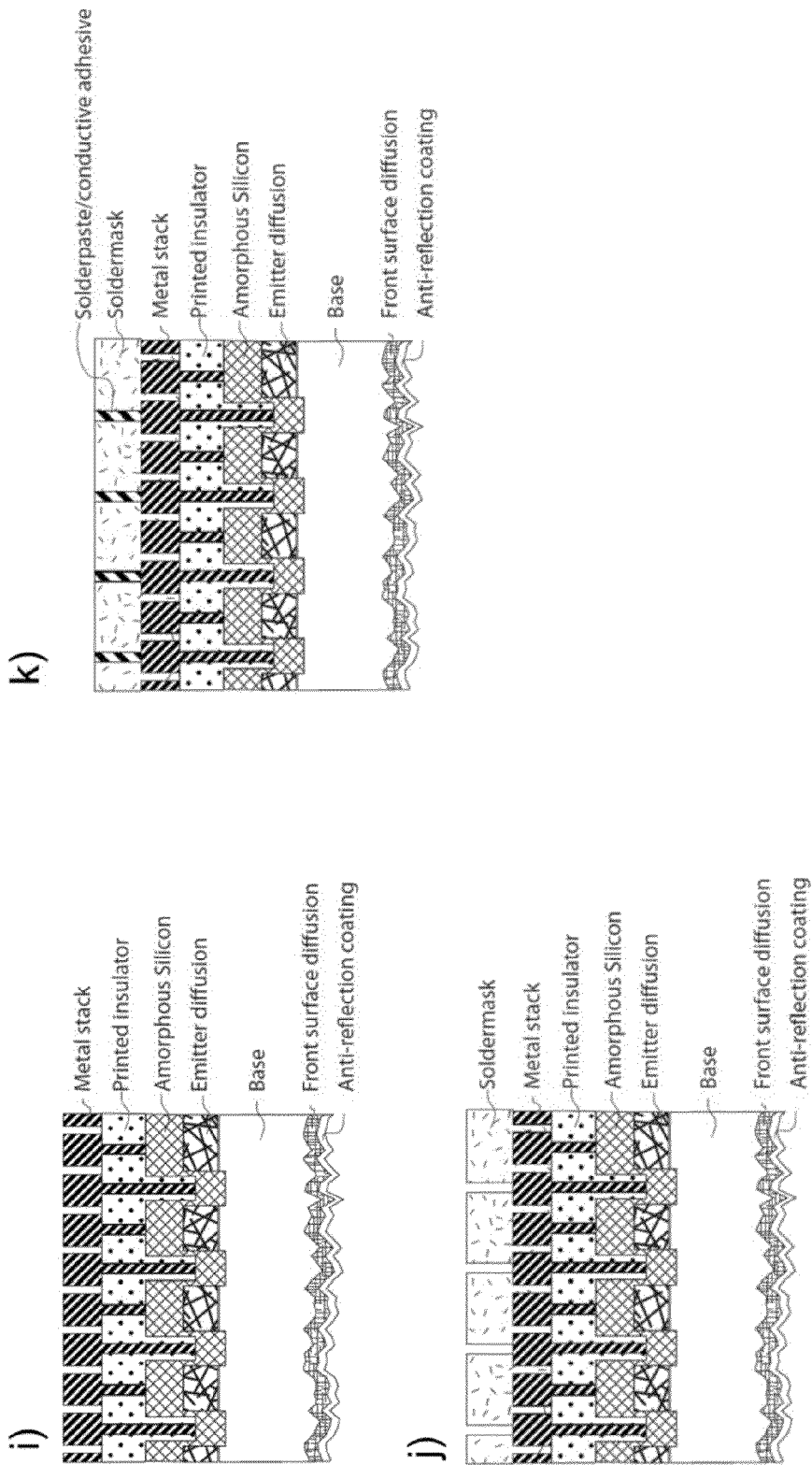
Figure 8 i) – k)

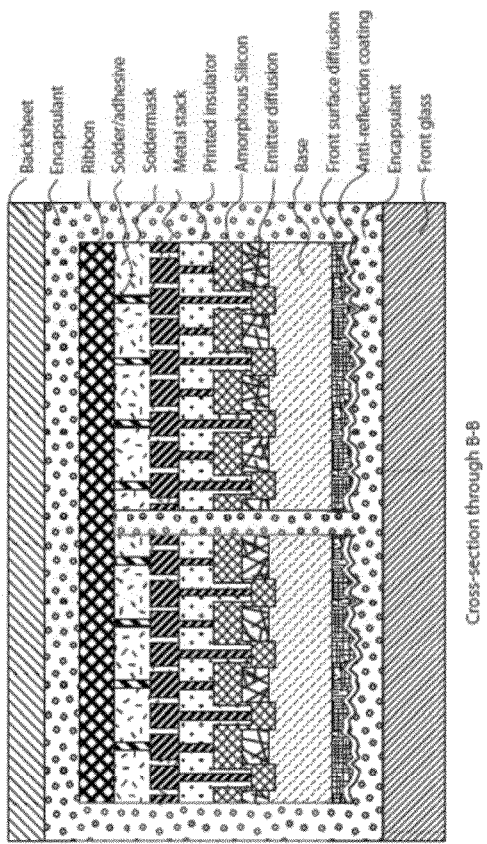
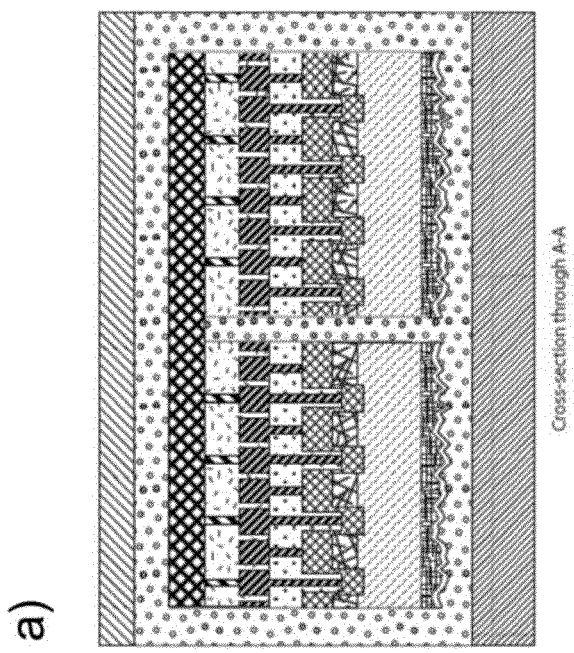
Figure 9 a) – b)

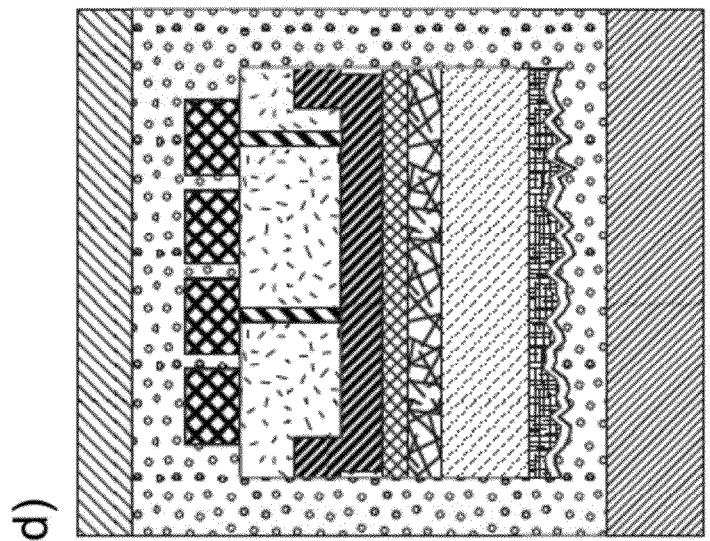
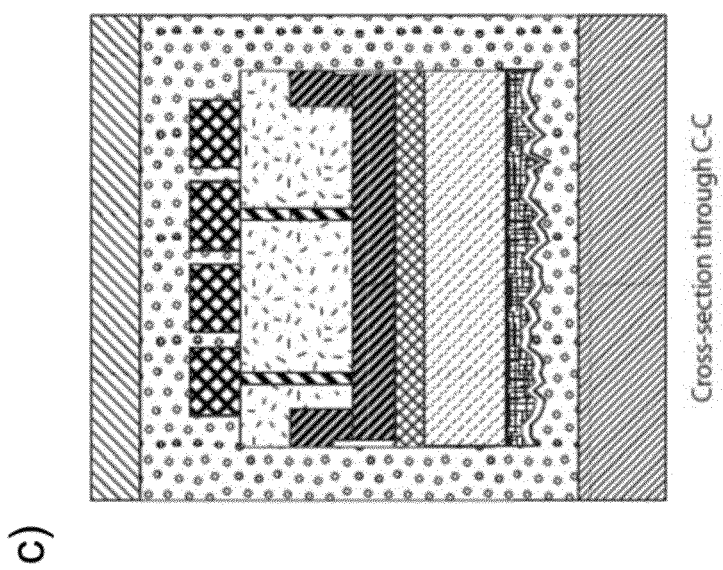
Figure 9 c) – d)

CELL AND MODULE PROCESSING OF SEMICONDUCTOR WAFERS FOR BACK-CONTACTED SOLAR PHOTOVOLTAIC MODULE

CROSS REFERENCE TO RELATED APPLICATIONS

This non-provisional application claims the benefit of U.S. Provisional Application Nos. 61/612,724, 61/612,746, 61/612,769, and 61/612,800 all of which were filed on Mar. 19, 2012. The entire contents of all of the above applications are hereby incorporated by reference.

FIELD OF THE INVENTION

The present invention relates to cost effective production methods of high efficiency silicon based back-contacted back-junction solar panels and solar panels made by the method.

BACKGROUND

There are raised many concerns that the use of fossil energy is increasing the earth greenhouse effect to an extent that may turn dangerous. Thus the present consumption of fossil fuels should preferably be replaced by energy sources/carriers that are renewable and sustainable for our climate and environment.

One such energy source is solar light, which irradiates the earth with vastly more energy than the present and any foreseeable increase in human energy consumption. However, solar cell electricity has up to date been too expensive to be competitive with nuclear power, thermal power, hydroelectric power etc. This needs to change if the vast potential of the solar cell electricity is to be realised.

The cost of electricity from a solar panel is a function of the energy conversion efficiency and the production costs of the solar panel. Thus the search for cheaper solar electricity should be focused at high-efficient solar cells made by cost-effective manufacturing methods.

The presently dominating processing route of silicon based solar panels may roughly be described as follows; manufacturing the solar grade feedstock in the form of crystalline blocks of high purity silicon, sawing the blocks into a set of thin wafers, cell processing each wafer to a solar cell, and then mounting the solar cells to form solar panels which are further installed and integrated as solar systems.

The present dominating processing route is however encumbered with a very low utility degree of the silicon feedstock, mainly due to two factors; the present day sawing process requires a minimum thickness of the wafers of 150-200 µm while the most significant photovoltaic active layer in the wafer is only about 20-30 µm, and the formation of the wafers by sawing results in about half of the solar grade silicon feed material being lost as kerf. It is thus highly desirable to find a process route for silicon based solar panels without need for sawing the wafers and which may form wafers with a thickness in accordance with the photovoltaic requirements.

Further, to create a solar module, cells are typically connected in a series electrical circuit such that the positive electrical output of the module is connected to the anode regions of the first cell and the negative electrical output of the module is connected to the cathode regions of the last cell in the series. For cell with an n-type base region, the n-type base region is the cathode and the p-type emitter regions form the anode. For cell with a p-type base region, the p-type base region is the anode and the n-type emitter regions form the cathode. The cells in between are connected such that the emitter regions of the first cell are connected to the base regions of the second cell, the emitter regions of the second cell are connected to the base regions of the third cell and so on until all cells are connected in a string. The interconnect method describes how this series electrical connection of cells can be achieved. Alternate circuit topologies are also possible using this interconnect method, such as cells connected as a parallel circuit or as a combination of series and parallel circuits, although these are generally not preferred since higher total currents are produced which require larger conductor cross-sections.

The cell metallization is a patterned layer or layers of metal disposed onto each solar cell such that electrical current can flow from the emitter and base semiconductor regions of the solar cell into the emitter and base metallization regions. The emitter and base metallization regions are patterned such that the emitter metal and the base metal to not make a direct electrical connection to each other. In general, a reduced metal-semiconductor contact area is preferred to reduce carrier recombination at the contacts, while a larger finger conductor area is preferred for lower resistive losses.

PRIOR ART

A method for manufacturing back contact back junction solar cells (BC-BJ cell) based on solar grade feedstock in the form of crystalline blocks of high purity silicon being sawed into wafers and then processed to BC-BJ cells is known from U.S. Pat. No. 6,337,283. The document discloses a method of fabricating a back surface point contact silicon solar cell having p-doped regions and n-doped regions on the same side by forming a passivating layer on a surface of the cell having opened windows at the p-doped regions and the n-doped regions, b depositing and patterning a first metal layer on the passivating layer in such a way that the first metal layer comes into contact with the p-doped regions and the n-doped regions, by depositing a first insulator layer of polyimide on the first metal layer, by etching and patterning the first insulator layer of polyimide in such a way that the insulator layer has opened windows at, at least one of the p-doped regions and the n-doped regions, by depositing a second insulator layer of polyimide on the first insulator layer of polyimide, by etching and patterning the second insulator layer of polyimide in such a way that the insulator layer has opened windows at, at least one of the p-doped regions and the n-doped regions, by curing the first insulator layer of polyimide by heating at a predetermined second temperature for a predetermined second time, and by depositing a second metal layer on the second insulator layer of polyimide in such a way that the second metal layer comes into contact with the one of the p-doped regions and the n-doped regions. With this, the cell surface to be soldered onto a metallized substrate is well planarized and even to ensure sufficient conductibility, with less voids and less solder fatigue.

A similar approach is known from WO 2008/039078 which discloses a method for producing a back-contacted solar cell, where the method comprises applying a silicon substrate, wafer or thin film, doped on the back side with alternating P-type and N-type conductivity in an interdigitated pattern and optionally a layer of either P- or N-type on the front side of the wafer, characterised in that the method further comprises:

depositing one or more surface passivation layers on both sides of the substrate, creating openings in the surface passivation layers on the back side of the substrate, depositing a metallic layer covering the entire back side and which fills the openings in the surface passivation layers, and creating openings in the deposited metallic layer such that electric insulated contacts with the doped regions on the back side of the substrate is obtained.

The problem of low utility degree of the solar grade feedstock when applying wafers sawn out of blocks has been solved by making solar cells from silicon films deposited on a substrate. An example of this technology is disclosed in Keevers et al. [1], where a photovoltaic panel comprising a polycrystalline thin film of silicon is deposited on a glass substrate. This technology is known as crystalline silicon on glass, or CSG-technology. The manufacturing process begins with texturing one surface of the glass substrate by dip-coating with 0.5 μm silica beads. Then a layer of $SiN_x$, and a layer of p-doped amorphous silicon are deposited onto the textured surface by use of plasma enhanced chemical vapour deposition (PECVD). Then a thin film of polycrystalline silicon is formed by use of solid phase crystallisation followed by a rapid thermal treatment and rapid in-line hydrogenation. The deposited semiconductor layer is then partitioned to a set of individual cells by use of laser scribing, before a resin layer is applied by roller coating. Then a set of contact openings in the resin layer is formed by ink-jet printing an etching agent before the panel is finished by depositing an Al layer by sputtering followed by scribing to form the interconnects. The drawback of this technology is low photovoltaic efficiencies of the solar cells as compared to wafer based monocrystalline solar cells.

WO 2009/128721 discloses a solution to the problem of low photovoltaic efficiencies by combining the traditional wafer based approach and the CSG-approach. This document discloses a method for producing solar panels which comprises employing a number of semiconductor wafers and/or semiconductor sheets of films prefabricated to prepare them for back side metallization, which are placed and attached adjacent to each other and with their front side facing downwards onto the back side of the front glass, before subsequent processing that includes depositing at least one metal layer covering the entire front glass including the back side of the attached wafers/sheets of films. The metallic layer is then patterned and divided into electrically isolated contacts for each solar cell and into interconnections between adjacent solar cells. This invention makes use of an adaption of the CSG-technology for wafer based solar cell production, and thus takes advantage of the work load savings associated with the CGS-technology and the high conversion efficiencies obtainable by use of monocrystalline or multicrystalline wafers.

From WO 2011/031707 it is known a method for fabricating a photovoltaic (PV) cell panel wherein each of a plurality of silicon donor wafers has a separation layer formed on its upper surface, e.g., porous anodically etched silicon. On each donor wafer, a PV cell is then partially completed including at least part of inter-cell interconnect, after which plural donor wafers are laminated to a backside substrate or frontside. All of the donor wafers are then separated from the partially completed PV cells in an exfoliation process, followed by simultaneous completion of the remaining PV cell structures on PV cells. Finally, a second lamination to a frontside glass or a backside panel completes the PV cell panel. The separated donor wafers may be reused in forming other PV cells. Use of epitaxial deposition to form the layers of the PV cells enables improved dopant distributions and sharper junction profiles for improved PV cell efficiency.

From US 2011/0303280 it is known a method for manufacturing interdigitated back contact photovoltaic cells which includes providing on a rear surface of a substrate a first doped layer of a first dopant type, and providing a dielectric masking layer overlaying it. Grooves are formed through the dielectric masking layer and first doped layer, extending into the substrate in a direction substantially orthogonal to the rear surface and extending in a lateral direction underneath the first doped layer at sides of the grooves. Directional doping is performed in a direction substantially orthogonal to the rear surface, thereby providing doped regions with dopants of a second dopant type at a bottom of the grooves. Dopant diffusion is performed to form at the rear side of the substrate one of the emitter regions and back surface field regions between the grooves and the other at the bottom of the grooves.

From US 2011/0315186 it is known a thin single crystalline silicon film solar cell and methods of forming the same, where the method includes forming a thin single crystalline silicon layer on a silicon growth substrate, followed by forming front or rear solar cell structures on and/or in the thin single crystalline silicon film. The method also includes attaching the thin single crystalline silicon film to a mechanical carrier and then separating the growth substrate from the thin single crystalline silicon film along a cleavage plane formed between the growth substrate and the thin single crystalline silicon film. Front or rear solar cell structures are then formed on and/or in the thin single crystalline silicon film opposite the mechanical carrier to complete formation of the solar cell.

OBJECTIVE OF THE INVENTION

The main objective of the invention is to provide a cost effective method of forming back-contacted back-junction high efficiency solar modules.

A further objective of the invention is to provide back-contacted back-junction high efficiency solar modules.

The objectives of the invention may be achieved by the features as set forth in the description below and in the appended claims and attached figures. The attached figures show embodiments of the invention.

DESCRIPTION OF THE INVENTION

The invention is based on the realization that the conversion efficiency of silicon based solar cells will be enhanced by employing back side electric contacts of which the contact area between the emitter and base regions of the silicon solar cell is obtained by a relatively large number of fingers and ribbons to enable short current paths, where each finger or ribbon has a relatively large surface area to minimize resistive losses and at the same time has relatively small contact areas with the semiconductor to minimize recombination of charges.

Thus in a first aspect, the present invention relates to a method for manufacturing a back-contacted back-junction silicon solar cell module, wherein the method comprises the following process steps in successive order:

A) forming a multiplicity of semi-finished solar cells, by performing a selected number at least including step ii) of the following wafer process steps in successive order and then go to step B) below:

i) employing a crystalline silicon wafer having a layered stratified doped structure at least containing a back-side emitter layer and a base layer below the emitter layer, and where the wafer has a multiplicity of alternating rectangular emitter- and base regions on the back side and ii) forming a texturing and depositing at least one surface passivation film on the front side of the wafer, iii) forming a back side surface passivation layer by depositing a continuous amorphous silicon layer covering the entire back side of the wafer, and iv) forming a first insulation layer onto the back side surface passivation layer with linear openings defining electric contact access areas running in parallel and located more or less directly above each of the multiplicity of alternating rectangular emitter- and base regions, v) forming a rectangular metallic electric finger conductor in parallel with and more or less directly above each of the multiplicity of alternating rectangular emitter- and base regions, vi) forming a second insulation layer onto the finger conductors with a set of access openings at positions where electric contact with the underlying finger conductor is intended, and vii) forming a via contact in each access opening in the second insulation layer in electric contact with the finger conductor lying below the access opening, B) laminating the multiplicity of semi-finished solar cells to a module front substrate with their front-side facing the module front substrate in a rectangular tessellated-resembling pattern and then perform the eventual remaining wafer process steps from Step A) in successive order on the laminated multiplicity of semi-finished solar cells until all wafer process steps including step vii) is performed, and then C) completing the process to form functional solar cells of the semi-finished solar cells by forming a set of ribbon contacts on top of the second patterned insulation layer for interconnection of the semi-finished solar cells of the module, and D) laminating a back-side cover substrate onto the back-side of the module front substrate including the multiplicity of solar cells.

The terms "front-side" and "back-side" as used herein are related to the orientation of the solar module or solar cells during normal operation, such that the front side is the side of the module or solar cells facing the sun and the back side is the opposite side facing away from the sun during normal operation of the solar module.

The term "more or less directly above" as used herein means that the object being placed above is allowed to have a certain slack in the positioning such that it need not be placed directly above in the mathematical sense of the term.

The term "silicon wafer" as used herein means any thin planar object of crystalline silicon having a stratified layered structure of doped silicon at least consisting of a first layer of thickness from 0.2-5 µm doped to a concentration from $1.1016$-$1 \cdot 10^{20}$ cm$^{-3}$ of either an N-type or P-type doping element and a second layer of thickness from 10 to 65 µm doped to a concentration from $1 \cdot 10^{15}$ to $1 \cdot 10^{17}$ cm$^{-3}$ of an doping element of the opposite conductivity of the first layer. There may advantageously also be a third layer of thickness from 0.2 to 5 µm doped to a concentration from $1 \cdot 10^{16}$ to $1 \cdot 10^{20}$ cm$^{-3}$ of either P-type or N-type doping element. The major surfaces of the silicon wafer may have one of the following geometries: squares, pseudo-squares, rectangles, or pseudo-rectangles, where "pseudo" refers to rounded corners, chamfered corners, or angled corners. The characteristic dimensions of the major surface of the wafers may advantageously be: length l and width d in the range from 50 to 400 mm, preferably 125-300 mm. The thickness, i.e. the shortest distance between the opposed major surfaces of the silicon wafer may be any known or conceivable thickness associated with solar wafers. However, the thickness may advantageously be a trade-off between the need for obtaining sufficient photovoltaic activity, avoiding excessive use of the silicon raw material and obtaining a sufficient mechanical strength of the wafer. Thus, the thickness of the first layer may advantageously be in one of the following ranges; from 0.2-5 µm, from 0.3-3 µm, from 0.3-2 µm, or from 0.4-1 µm, the thickness of the second layer may advantageously be in one of the following ranges; from 10 to 65 µm, from 20 to 50 µm, or from 30 to 40 µm, and the thickness of the third layer may advantageously be in one of the following ranges; from 0.5-20 µm, from 1-10 µm, from 1-5 µm, or from 1-3 µm.

The concentration of doping elements in the first layer of the wafer may advantageously be in one of the following ranges; from $1 \cdot 10^{16}$-$1 \cdot 10^{20}$ cm$^{-3}$, from $1 \cdot 10^{17}$ to $1 \cdot 10^{20}$ cm$^{-3}$, from $1 \cdot 10^{18}$-$5 \cdot 10^{19}$ cm$^{-3}$, or from $1 \cdot 10^{19}$-$5 \cdot 10^{19}$, in the second layer may advantageously be in one of the following ranges; from $1 \cdot 10^{15}$ to $1 \cdot 10^{17}$ cm$^{-3}$, from $5 \cdot 10^{15}$ to $5 \cdot 10^{16}$ cm$^{-3}$, or from $1 \cdot 10^{16}$ to $5 \cdot 10^{16}$, and in the third layer may advantageously be in one of the following ranges; from $1 \cdot 10^{17}$-$1 \cdot 10^{20}$ cm$^{-3}$, from $5 \cdot 10^{17}$ to $5 \cdot 10^{19}$ cm$^{-3}$, or from $1 \cdot 10^{18}$-$1 \cdot 10^{19}$ cm$^{-3}$. In order to form the back junction feature of the solar cells, it is mandatory to have an opposite conductivity of the first and second deposited layer. That is, if the first layer is given N-type conductivity, the second layer must be given P-type conductivity, or vice versa; if the first layer is given P-type conductivity, the second layer must be given N-type conductivity. Due to the above specified concentration levels, the first layer is relatively heavy doped and will thus form the emitter layer of the solar cell and the second layer will form the base layer of the solar cell. The invention may thus form solar cells having an emitter layer of either P- or N-type. The third layer may form either floating junction or front surface field layer of the solar cell and may have conductivity independent of the base layer conductivity. That is, the third layer may have either an N- or P-type conductivity regardless of whether the base layer is of P- or N-type. The possible configurations of the stratified three layer wafer of the solar cell according to the present are given in Table 1.

TABLE 1

Possible configurations of the stratified layers of the solar cell according to the present invention

| | Conductivity | | | |
|---|---|---|---|---|
| Layer | Configuration 1 | Configuration 2 | Configuration 3 | Configuration 4 |
| 1 | $N^{++}$ | $P^{++}$ | $N^{++}$ | $P^{++}$ |
| 2 | P | N | P | N |
| 3 | $N^+$ | $P^+$ | $P^+$ | $N^+$ |

The term "P-type doping" as used herein means a bulk area of the silicon wafer where a doping material resulting in an increased number of positive charge carriers forming a region of the wafer with P-type conductivity. The term "N-type doping" as used herein means a bulk area of the silicon wafer where a doping material resulting in an increased number of negative charge carriers (mobile electrons) forming a region of the wafer with N-type conductivity.

Interdigitated Emitter and Base Regions

The term "multiplicity of alternating rectangular emitter- and base regions" as used herein means that on the back-side of each of the stratified layered solar silicon wafers, there is removed a set of rectangular sections of the emitter layer to expose the underlying base layer of the wafer as shown in FIGS. 1 a) and 1 b). As may be seen from FIG. 1 a), the silicon wafer has three layers, the front surface field layer 4, a base layer 5 and an emitter layer 6 of which regular sections are removed to form back-side areas 7 where the base layer 5 is exposed. From FIG. 1 b) it is seen that the removed portions of the emitter layer 6 are equidistant and rectangular such that there are formed an equal number of equal sized emitter and base regions on the back-side of the silicon wafer. The figures illustrate a total of four emitter 6 and four base 7 regions. The number of four is chosen only for illustrating purposes, real life solar cells may have many more of these areas. From FIG. 1 b) it is seen that the removed portions of the third layer 6 are rectangular and extends over the entire width of the wafer 1 such that there are formed an equal numbered multiplicity of equidistant, parallel, interdigitated, and rectangular P- and N-type doped silicon regions on the back-side of each solar cell. It is advantageous, but not mandatory, to form an equal numbered multiplicity of P-type and N-type doped regions on the solar cells, there may be applied solar cells having an unequal number of P-type and N-type doped regions in this multiplicity. However, it is advantageous to apply wafers having an equal numbered multiplicity of a number n of P-type and a number n of N-type doped regions, where n is a number resulting in a pitch (distance between two adjacent emitter regions or two adjacent base regions) in one of the following ranges; from 0.1 to 5 mm, from 0.2 to 4 mm, from 0.3 to 3 mm, or 0.5 to 2 mm. The number n corresponds to the number of regions of one type polarity in the multiplicity, and will thus typically be in the range from 75 to 500. The Figures give the impression that the width of the emitter- and base regions of the multiplicity of alternating rectangular emitter- and base regions are equal. This is not to be interpreted as a limitation of the invention. In practice, it may be advantageous to have emitter regions covering 70-80% of the pitch, i.e. that the emitter region is wider that the base region. The invention may apply emitter regions covering any known or conceivable percentage of the pitch.

In order to allow for production slack, each wafer may advantageously be made somewhat wider than required to form the multiplicity such that there is formed one peripheral residual part of the third layer along one side edge of each semi-finished solar cell. This residual part is marked with reference number 8 in the Figures, and will constitute a dead area of each solar cell. The width of this region should naturally be as short as practically possible/desirable.

The invention is not tied to any specific method for selective removal of the emitter layer to form the multiplicity of alternating rectangular emitter- and base regions, but may apply any known or conceivable method associated with removal of crystalline silicon in solar wafers. An example of a suited method is selective chemical etching of the emitter layer, either by applying an etching mask or by ink-jet printing of an etching agent. The process of selective removal of crystalline silicon by chemical etching is well known to a person skilled in the art, and needs no further description.

Front Side Processing of the Wafers

The present invention may apply any known or conceivable process for front side texturing, surface passivation and eventually deposition of an anti-reflective coating. The invention may thus apply any known type of surface texturing, surface passivation (one or more layers of dielectric films) and eventual anti-reflective coating. The techniques required to obtain these process steps are well established in the photovoltaic industry and need no further description.

Back-Side Surface Passivation

The back-side of the wafers, should however be surface passivated by deposition of a 1-50 nm thick continuous amorphous silicon layer covering the entire back side of the wafers. Any known or conceivable method for depositing a thin layer of amorphous silicon on a silicon semiconductor surface may be applied. The techniques required to obtain these process steps are well established in the photovoltaic industry and need no further description.

The amorphous silicon layer may advantageously have a thickness in the range of 1-50 nm. Any known or conceivable method for depositing a thin layer of amorphous silicon on a silicon surface may be applied. Deposition of α-Si films by CVD is well known to a person skilled in the art and needs no further description.

It may advantageously be applied a second surface passivation layer of $SiN_x$ which is deposited onto the amorphous silicon. The deposition of $SiN_x$-films by CVD is well known to a person skilled in the art and needs no further description.

First Insulation Layer

After formation of the back-side surface passivation, a first insulation layer is deposited onto the amorphous silicon layer, alternatively onto the $SiN_x$-layer. The function of this first insulation layer is to be an electric insulation preventing the subsequently deposited metal layer from short-circuiting the solar cell and to act as a "printing mask" which defines the areas where the subsequently deposited metal layer is to obtain electric contact with the P- and N-type regions (base and emitter regions) of the solar cells, i.e. the terminals or fingers of each solar cell. The contact areas of the emitter and base regions of the silicon wafer may advantageously have small surface areas to reduce the charge carrier recombination and at the same time allow formation of multiple electrical contact points between the fingers and the module current collectors (the ribbons), to obtain short current paths in the solar cell and thus low resistive current losses.

This may simply and effectively be obtained by aligning and attaching the rectangular semi-finished solar cells in a regular rectangular grid onto the module front substrate such that both the P-type regions and the N-type regions of adjacent cells defines linear segments in one transverse direction of the major surface of the module front substrate, and by patterning the first insulation layer such that it obtains relatively thin and rectangular elongated voids running in parallel and aligned above the centre of each P- and N-type region of each solar cell of the solar module. This is illustrated schematically in FIG. 2 a) and b) which illustrates the same embodiment as shown in FIG. 1 a) and b), but which have been given a continuous thin layer 9 of amorphous silicon and a patterned layer 10 having voids 11 over the centre of each base region 7 and emitter region 6, both layers are made to cover the entire back-side of the wafer 1 except for the voids 11 in layer 10. The continuous layer 9 is the amorphous silicon and the patterned layer 10 is the first insulation layer. FIG. 2b illustrates the embodiment of FIG. 2a as seen from above, and the rectangular elongated form of the voids 11 is seen to extend from one side edge of the wafer to the other. Each void 11 forms areas where the amorphous layer 9 is exposed.

The first insulation layer 10 may advantageously be light reflective to enhance the light trapping effectiveness of the solar cells by reflecting photons having traveled through the semiconductor silicon wafer without being absorbed back into the bulk phase of the semiconductor. This feature might have a pronounced effect when applying very thin semiconductor wafers of about 30 µm or less.

The invention may apply any known or conceivable electrically insulating material in the first insulation layer which is associated or compatible with use in solar cells. An example of a suitable class of materials is polymers which are electric insulating (having resistivity [$\rho(\Omega \cdot m)$] of the order of $10^{16}$ or higher) and which are heat resistant at the operating temperatures of solar modules. The first insulation layer may advantageously have a thickness in the range from 1 to 10 µm and the width of the linear electric contact access area may be a factor from 0.5 to 0.05, or a factor from 0.25 to 0.1, of the width of the underlying base or emitter region, in practice resulting in a width of the linear contact area from 50 to 200 µm. The polymer of the first insulation layer may be thermo-set at temperatures up to about 300° C.

After formation of the first insulation layer 10, the exposed areas of the amorphous silicon layer 9 may advantageously be cleaned by plasma ashing in $O_2/N_2O$, and or a hydrofluoric etching to remove eventual native oxide or $SiO_2/SiN_x$ covering the amorphous silicon layer. This feature is mandatory in case the back-side of the semi-finished solar cells are provided with a second surface passivation layer of $SiN_x$ in order to etch away the $SiN_x$ layer in the linear contact areas and enabling the subsequent deposited metal phase to contact the amorphous silicon. The semi-finished solar cells are now ready for metallisation, i.e. formation of the finger conductors functioning as the electric terminals for collecting the current produced in the solar cells.

Finger Conductors

The finger conductors may be formed by depositing a metallic phase (layer) onto the entire back-side of the wafer and then patterned to define rectangular elongated fingers which collect the current from the emitter- and base regions of the cell. Alternatively; the finger conductors may be formed directly by depositing a patterned metallic phase.

The patterning of the metallic phase into the rectangular finger conductors may advantageously be such that it defines finger conductors which extend over the entire depth of the wafers and which are aligned in parallel more or less directly above the centre axis of their corresponding emitter- or base region of the underlying semiconductor wafers. This feature provides the advantage of being a simple and cost effective method for manufacturing the finger conductors. Another advantage is that due to forming the finger conductors in parallel more or less directly above each emitter- and base region but separated from them by the first insulation layer 10, the finger conductors are spatially scattered and allowed to cover almost the entire back-side surface area of each solar cell of the module. This provides the advantage of allowing formation of current paths in the solar cells with relatively short lengths and thus low resistive losses. The relatively huge surface area of the finger conductors provides the advantage of allowing employing a relatively thin metallic phase which significantly reduces the metal consumption in the metallisation process and at the same time has low resistive losses. Thus, a suited patterning of the metallic phase is to define one finger conductor above each base- or emitter region which extends across the entire length or width of the solar cell, and which are located above at the longitudinal centre axis of the back-side surface of the corresponding emitter- or base region, and having a width between 0.8 and 1.0 times the width of the underlying emitter- or base region.

The invention may employ any known or conceivable method for depositing a thin metallic phase on the first insulating layer. The metallic phase may have a thickness from a few hundred nanometers up to a few micrometers, as opposed to prior art metallisation solutions of solar cells which often requires conductive fingers with thickness from 20 µm and above to avoid excessive resistive losses, and the invention may thus employ plasma vapour deposition (PVD) techniques for forming the metallic phase on the entire back-side of the solar module in one operation. Examples of suited PVD-techniques includes, but is not limited to; DC magnetron sputtering and thermal evaporation. These small thicknesses of the metallic phase constitutes a significant cost and energy saving compared to prior art by requiring considerably less material (metal/alloy) for forming the finger conductors. The thickness of the metallic phase may advantageously be in one of the following ranges; from 200 nm to 20 µm, from 200 nm to 10 µm, from 300 nm to 5 µm, from 300 nm to 2 µm, from 350 nm to 1 µm, or from 350 nm to 800 nm. The thickness of the metallic phase is measured across the bulk phase of phase, i.e. in areas where the metallic phase is deposited onto the first insulation layer 10 and is not filling the voids 11.

The metallic phase may be a single metal layer or alloy, but may alternatively be a metal stack (stratified layered structure) consisting of two or more different metals and/or alloys. The metallic phase may be deposited as a continuous film and subsequently patterned through means of laser ablation, mechanical scribing or other means. Alternatively, a sacrificial lift-off material such as wax or polymer may be deposited onto the back-side surface prior to metal deposition to enable selective removal of the metal overlying the lift-off material. Alternatively, a mechanical shadow mask may be paced on the back-side of the semi-finished solar cell prior to deposition to allow patterned deposition of metal onto the back surface of the cell. The invention may apply any known or conceivable method for patterning the metallic phase into terminals and finger conductors, or to perform a patterned deposition.

A metal stack provides the advantage of allowing employing two or more different metals and/or alloys to tailor the properties of the metallic phase. For instance, by employing a metal stack comprising an adhesion layer for contacting the silicon semiconductor (i.e. the amorphous silicon layer 9 at the bottom of the voids 11 in the first insulation layer 10), one intermediate solder barrier layer and one upper contact layer, the metallic phase may provide the combined effect of a low-resistance contact between the cell metallization and the solder or conductive material for electric contact with the ribbons, a low-resistance contact between the cell metallization and the semiconductor cell material, prevents solder from damaging the metal-semiconductor contact and improves corrosion resistance of the cell metallization structure. For example, Al and Al—Si alloys are known to provide low resistance metal-semiconductor contacts in silicon based solar cells, such that on or these may advantageously be applied as the adhesion layer. On the other hand, Al will form a non-conductive surface oxide on exposure to air, which limits the ability to make a low electrical resistance contact, and which makes Al less suited for the upper contact layer. More suitable metals for the upper contact layer are those which have conductive surface oxides, such as Sn or Ag and their alloys, or metals that oxidise slowly such as Cu, or noble metals such as Au or Pt which will not oxidise. The solder barrier metal may be a first row transition metal of the Periodic Table, such as i.e. V, Cr, Ni or an alloy of these metals. In a typical embodiment, the layer in contact with the semiconductor is Al, the solder barrier layer is a Ni—Cr alloy and the upper contact layer is a Sn—Cu alloy.

In embodiments where soldering is used to form the electric contact between the fingers and the ribbons, the upper contact layer of the metal stack may be consumed by the solder layer. This may be prevented by having a solder barrier layer underneath the upper contact layer which hinders the solder from alloying with the semiconductor contact layer. If the semiconductor contact layer is a reactive metal such as Al or an Al alloy, the solder barrier layer can also act to reduce corrosion of the semiconductor contact layer over the life of the solar module. In this case, the upper contact layer may advantageously be chosen among Cu, Sn and Ag containing alloys, and the alloy may advantageously have a melting point above that of the solder so that the upper metallization does not de-wet from the solder barrier layer. The upper contact metals may be similar when conductive adhesives or conductive films are used. The optional upper contact preservative layer is a thin surface layer used to prevent oxidation of the upper contact layer. This may advantageously be a Cu—Sn—Ag containing alloy or a Cu—Sn alloy or Sn, which may have a melting point below that of the solder. Noble metals such as Au, Ag or Pd may also be used. Organic solderabilty preservative (OSP) materials such as azole-derived organometallic polymers may also be used as the upper contact preservative layer. Examples of metal stacks suited for the present invention includes, but are not limited to; continuous films of Al/NiCr/Cu, Al/NiCr/SnCu, or AlSi/NiV/SnCu, where the Al or Al-containing alloy is the adhesion layer in contact with the amorphous silicon layer 9. A typical example of metallization would be 300 nm of Al as a semiconductor contact layer, followed by 50 nm of $Ni_{0.8}Cr_{0.2}$, followed by 50 nm of Cu all deposited by DC magnetron sputtering in a multi-chamber tool, using planar targets and Ar as a sputtering gas.

When applying Al or AlSi-alloys as the adhesion layer of the metal stack, the electric contact with the semiconductor wafer may be obtained by simply depositing the adhesion layer directly onto the amorphous silicon layer and then perform a gentle heat treatment which will transform the amorphous structure of the silicon layer in-between the silicon semiconductor and the Al or AlSi-alloy containing adhesion layer to electric conductive crystalline silicon.

The metallisation step or formation of the terminals/finger conductors results in the structure illustrated schematically in FIG. 3 *a*) and *b*). FIG. 3 *a*) is a side view of the same embodiment as in FIGS. 1 *a*) and 2 *a*), but after the formation of the finger conductors. FIG. 3 *b*) is the same embodiment as FIG. 3 *a*), but seen from above.

From FIG. 3 *a*) it may be seen that that more or less right above every base region 7 and emitter region 6 of the semi-finished solar cell 1, there is a terminal or finger conductor 14 which fills the void 11 in the first insulation layer 10 and thus obtains direct contact with the amorphous silicon film 9 at the bottom of the voids 11, and that the terminals widen out by covering the first insulation layer 10 except at voids 13. Each base and emitter region of the semiconductor wafer of the solar cells is thus electrically contacted by one finger conductor having a small contact area towards the semiconductor (amorphous silicon layer 9, which becomes crystallised and electric conductive in this area) and a large surface area covering almost the same area as the corresponding base- or emitter region does. There will also be formed electrically insulated regions 12 of the deposited metal layer which are inactive, i.e. not electrically connected to the semiconductor wafer, in the peripheral regions of each solar cell. From FIG. 3 *b*) it is seen that the terminals or finger conductors 14 extend from one side edge to the opposite side edge of the back-side of the semi-finished solar cell and that they are separated by voids 13. Each void 13 forms areas where the first insulation layer 10 is exposed. The figure clearly shows that the combined surface area of the finger conductors 14 are almost covering the entire available back-side surface of the solar cells 1, and thus reducing the resistive losses in the finger conductors to a minimum.

Second Insulation Layer

After formation of the finger conductors, a second insulation layer is deposited onto the metallic phase. The second insulation layer has the function of electrically insulating the finger conductors from the module interconnection or ribbons except at specific contact areas where electric contact between the finger conductors and ribbons are intended, analogous to the function of the first insulation layer. Thus, the use of a second insulation layer provides the same advantages as described above, but now for the interconnections or ribbons of the solar module. That is, thanks to the second insulation layer, the ribbons may be made from a thin layer of an electric conducting material with a huge surface area to reduce the resistive losses in the ribbons to a minimum.

The invention may apply any known or conceivable electrically insulating material in the second insulation layer which is associated or compatible with use in solar cells. Examples suitable materials include, but is not limited to, the polymers described above for the first insulation layer, an adhesive, or a printable insulating ink, etc. The second insulation layer may advantageously have a thickness in the range from 1 to 10 µm, but may also have other thicknesses.

The second insulation layer may be a single continuous layer covering the entire back-side of the semi-finished solar cell except at the contact access areas. Alternatively, the second insulation layer may be made to cover the cells of the laminated multiplicity of solar cells, or it may be patterned or deposited to only insulate the specific areas where electric insulation between the finger conductors and ribbons is required. Another possibility is to deposit adhesive strips of insulating material as the second insulation layer. This may be obtained by applying a patterned adhesive onto the metallic phase (finger conductors), or a printable insulating ink i.e. such solder mask as is typically used when fabricating Printed Circuit Boards (PCBs).

In one alternative, it may be deposited an un-patterned continuous second insulation layer, and use the subsequent patterned print of conductive material to selectively etch through, penetrate, melt or dissolve the second insulation layer in selected regions. The patterned conductive layer may also act as a shadow mask to prevent UV curing of the underlying insulator, thus allowing the conductor to penetrate the insulator in the selected areas. These techniques remove the need for patterning the second insulation layer, and so is a potentially lower cost approach.

Another possibility for depositing the second insulation layer is to print the via conductor pads directly onto the cell metallization, and then flow a self-levelling insulator layer around the conductor pads to form the second insulating layer. This has the advantage of removing the need for patterning the second insulation layer.

In a typical embodiment, ultraviolet (UV) light curable solder mask is screen printed over the cell metallization such that holes are formed in the solder mask directly over the metal fingers. The solder mask is cured by exposure to UV light, and is then ready for further processing. Other solder mask alternatives may be used such as thermal cure solder mask or a patterned adhesive film.

The second insulation layer designs may enable simplified manufacturing of the second insulation layer and enable the use of adhesive strips of insulating material as the second insulation layer. This may be obtained by applying a patterned adhesive onto the metallic phase (finger conductors) of the solar module, or a printable insulating ink i.e. such solder mask as is typically used when fabricating Printed Circuit Boards (PCBs). It is also possible to deposit an un-patterned continuous second insulation layer, and use the subsequent patterned print of conductive material to selectively etch through, penetrate, melt or dissolve the second insulation layer in selected regions. The patterned conductive layer may also act as a shadow mask to prevent UV curing of the underlying insulator, thus allowing the conductor to penetrate the insulator in the selected areas. These techniques remove the need for patterning the second insulation layer, and so is a potentially lower cost approach.

Another possibility for depositing the second insulation layer is to print the via conductor pads directly onto the cell metallization, and then flow a self-levelling insulator layer around the conductor pads to form the second insulating layer. This has the advantage of removing the need for patterning the second insulation layer. In a typical embodiment, ultraviolet (UV) light curable solder mask is screen printed over the cell metallization such that holes are formed in the solder mask directly over the metal fingers. The holes in the solder mask resemble a checkerboard pattern. The solder mask is cured by exposure to UV light, and is then ready for further processing. Other solder mask alternatives may be used such as thermal cure solder mask or a patterned adhesive film.

Access Openings and Electric Via Contacts

The access openings in the second insulation layer defines through-going openings in the insulation layer to enable forming electric through-going conductive across the second insulation layer at areas where electric contact between the underlying terminals or finger conductors and the module interconnects is intended. Thus the term "via contacts" as used herein means electric conductive gates through the second insulation layer electrically connecting the underlying finger conductor and the overlying ribbon.

The via contacts may advantageously be formed by filling the access openings with an electrically conductive material. The invention may apply any known or conceivable electrically conductive material able to be deposited into the access openings and obtain electric contact with the underlying finger conductor. Examples of suitable materials include, but are not limited to; a conductive film, a conductive adhesive or a solder. A conductive film is a conductive adhesive film applied between the ribbon and the cell metallization. The film is typically activated by heat and pressure. The conductive film may be applied to either the ribbon or the cell, and the assembly pressed together and heated to form the assembly. Conductive adhesives typically contain metal particles suspended in an adhesive polymer. Such material can be deposited in the access openings in the second insulation layer by needle dispensing, inkjet printing, screen printing, stencil printing, or other suitable printing method. Typically the adhesive is heat cured to form a strong conductive bond between the ribbon and the cell metallization. Solder paste can be deposited in the access openings by stencil printing or other suitable method. The solder paste may be of a conventional type used for printed circuit board manufacture or a low temperature type, and may contain fluxes and strengthening epoxy. The solder paste may be melted before the ribbons are attached in an oven or by a hot-air blower or other system to form solid solder pads in the access openings, or the solder paste may be melted after the ribbons have been placed into the second insulation layer.

An alternative to using solder paste is to form solder pads on the access openings by wave soldering or dipping the module into a solder bath. The second insulation layer will act a solder mask in this case so that solder will only adhere to the cell metallization areas exposed by the access openings. Another alternative to using solder paste is leave the access openings unfilled before the ribbons are placed on top, and then melt the solder coating on the ribbon such that the solder is pressed into the via hole and is able to wet both the cell metallization and the ribbon surfaces.

The access openings may advantageously be patterned such that one or more ribbons of one solar cell may obtain electric contact with multiple emitter finger conductors without contacting a base finger conductor on the same cell, and similarly, that one or more ribbons of one solar cell may contact multiple base finger conductors without contacting an emitter finger conductor on the same cell. The pattern may advantageously be designed such that the ribbons may span across two adjacent cells in a row of the solar module and contacting the emitter finger conductors on one cell and the base finger conductors of the adjacent cell to enable a series interconnection of cells.

One example of a suitable design of the second insulation layer is illustrated schematically in FIGS. 4a, 4b, and 4c. FIGS. 4a and 4b is a side view of the same embodiment as in FIGS. 1a and 2a, but after the formation of the finger conductors and the second insulating layer 16. The figures illustrates the cross-section of the solar module along two intersections planes indicated by dotted lines A-A and B-B in FIG. 4c, respectively. FIG. 4c is the same embodiment as shown in FIGS. 4a and 4b seen from above. From FIGS. 4a and 4b it is seen that the second insulation layer 16 is deposited onto the finger conductors and covers the back-side surface of laminated multiplicity of solar cells including the voids 13, except for a number of access openings 17 or 18 in the second insulation layer. Each access opening 17 or 18 is filled with an electric conductive material to allow electric contact with the underlying finger conductor 14. By comparison FIG. 4c with FIG. 3b, it is seen that the dotted lines A-A and B-B are oriented perpendicularly in relation to the underlying finger conductors 14, and that the access openings 17, 18 are patterned to define four rows of contact points for each solar cell 1, and that the access openings 17, 18 along the row defined by the dotted line A-A are made to contact either the base type finger conductors 14, or the emitter type finger conductors 14 of each solar cell 1. The access openings forming electric via contact points with the base type finger conductors are denoted by reference number 17, and the access openings forming electric contact via points with the emitter type finger conductors are denoted by reference number 18.

In one example embodiment of applying a multiplicity $M=k \cdot l$ solar cells laid out in a regular rectangle in the solar module, the use of semi-finished solar cells having the above described multiplicity of interdigitated emitter- and base regions with corresponding finger conductors, allows forming the access points such that they define a rectangular pattern of n columns and m rows for each solar cell, where each column is a linear set of m access points above one of either an emitter- or base type finger conductor of the solar cell, and each row defines a linear set of n access points for ribbons oriented perpendicularly in relation to the finger conductors, and where for every odd numbered solar cell of every row of the multiplicity of $M=k \cdot l$ solar cells of the solar module, the rectangular pattern of m·n access points is made such that each access point in every odd numbered row in the set of m rows is made to contact the finger conductor in electric contact with the emitter type regions of the solar cell, and every even numbered row in the set of m rows is made to contact the finger conductor in electric contact with the base type regions of the solar cell, and for every even numbered solar cell of every row of the multiplicity of $M=k \cdot l$ solar cells of the solar module, the rectangular pattern of m·n access points is made such that each access point in every odd numbered row in the set of m rows is made to contact the finger conductor in electric contact with the base type regions of the solar cell, and every even numbered row in the set of m rows is made to contact the finger conductor in electric contact with the emitter type regions of the solar cell. However, the invention may apply any known or conceivable pattern of access openings which allows forming ribbons electrically connecting, preferably in series, the underlying emitter type and base type finger conductors of the solar cells of the module.

Lamination of the Multiplicity of Semi-Finished Solar Cells

The present invention applies semi-finished solar cells which at least have formed the interdigitated multiplicity of alternating rectangular emitter- and base regions on the backside of the silicon wafers, and where the front side is processed up to the point where the semi-finished solar cells may be laminated onto the module front substrate. The remaining process steps on the back side of the semi-finished solar up to the formation of the cell interconnections may either be performed on each wafer separately before lamination, or on all cells of the multiplicity of solar cells in the module simultaneously after lamination onto the module front substrate. The lamination may i.e. take place after any back-side process step as defined in steps iii) to vii) of the first aspect of the invention, i.e. from the step of forming the back side surface passivation layer up to but not including the step of forming the cell interconnections. The eventual back-side process steps remaining to finish the semi-finished solar cells up to and including the via conductors in the second insulation layer after lamination, needs of course to be performed on the laminated multiplicity of semi-finished solar cells.

The multiplicity M of semi-finished solar cells will be attached to a module front substrate in a rectangular tessellated-resembling pattern of k rows and l columns. The module front substrate may be any planar transparent substrate able to function as the front side protective cover for the solar cells. The solar cells are to be attached to the back-side of the module front substrate in the rectangular tessellated-resembling pattern with their front side facing the module front substrate, and thus cover as much as possible of the surface area of the back-side of the module front substrate. The attachment of the semi-finished solar cells to the module front substrate may advantageously be obtained by lamination using a transparent adhesive on the back-side of the module front side. The invention may apply any known or conceivable method and transparent adhesive for laminating solar cells to the module front substrate. One example of a suited lamination adhesive is ethylene-vinyl acetate (EVA) which may be applied on the back-side of the module front substrate in any appropriate thickness, such as i.e. from 1 mm or less, from 100 μm or less, or from 30-50 μm. The lamination may then be obtained by having the semi-finished solar cells laid out on a lamination board in the intended tessellated pattern with their front side facing the module front substrate and applying heat and pressure to cure the EVA and firmly attach the semi-finished solar cells to the module front substrate. The module back substrate may be laminated in a similar process, after the semi-finished solar cells are processed to fully functional solar cells and electrically interconnected. The module back substrate may be laminated in a similar process, after the semi-finished solar cells are processed to fully functional solar cells and electrically interconnected.

The term "rectangular tessellated-resembling pattern" as used herein, means thus that the intended number, i.e. the multiplicity M of either square, pseudo-square, rectangular, or pseudo-rectangular semiconductor wafers are aligned in a regular pattern defining k rows and l columns of solar cells all with their front-side facing the module front substrate. The regular rectangular pattern ensures that the emitter and base regions of solar cells in the same column will be aligned right above each other as shown in i.e. FIG. 5, which illustrates an example embodiment of four rectangular semiconductor wafers. As shown in the figure, the base regions of the upper wafer (indicated by access opening 17) is right above the base regions 7 of the lower wafer as indicated by the dotted line C-C, and the emitter regions 6 (indicated by access opening 18) of the upper wafer is right above the emitter regions 6 of the lower wafer as indicated by the dotted line D-D. The wafers are placed in a relative short distance apart from each other, such that almost the entire surface area of the module front substrate is covered with solar cells.

Ribbons

After formation of the second insulation layer and the access openings allowing electric contact with the underlying finger conductors, the solar cell prosecution is finalised by forming the interconnections or ribbons. The ribbons of the module conduct the current in and out of individual cells of the module, and should thus be made to obtain electric contact with specific via contacts in the insulation layer to obtain the intended interconnection. There are known several solutions for interconnecting the emitter and base regions of the solar cells in a solar module. The present invention is not tied to any specific solution of interconnection, but may apply any known or conceivable solution for interconnection compatible with the interdigitated pattern of rectangular finger conductors described above. Thus the term "an intended selection of via contacts" as used herein means that the ribbons are made to contact the required via contacts to obtain the actual solution for cell interconnection being applied.

Due to the back-contacted cell structure, the ribbons will not optically shadow the cells, thereby allowing wider ribbons to be used without the penalty of shading losses. For example a 6 mm×50 μm ribbon will have the same cross-section and per unit length resistive loss as a 2 mm×150 μm ribbon. As for the first metallic phase defining the finger conductors, the use of an intermediate insulation layer (the second insulation layer) allows forming ribbons with small contact areas towards the finger conductors, relatively many contact points allowing short current paths, and forming ribbons with a thin layer of metal to save material costs, and which have ribbons of a relatively huge surface are to minimise resistive losses. The thickness of the ribbons may advantageously be in one of the following ranges; from 10 to 300 μm, from 20 to 200 μm, from 30 to 100 μm, from 30 to 60 μm, or from 35 to 50 μm. The width of the ribbons may advantageously be in one of the following ranges; from 0.1 to 20 mm, from 0.3 to 15 mm, from 0.5 to 10 mm, from 1 to 8 mm, or from 3 to 6 mm.

The ribbons may be metal ribbons, wires, foils or other types of electrical conductors. Examples of suited ribbons include, but is not limited to, metal strips or bands of solid copper core coated with pure Sn or a Sn solder alloy. Another example is ribbons made by a printed or dispensed metal paste, either applied by hot dip coating or plating. A typical method of forming the ribbon connection is to unroll a suitable length of ribbon, which i.e. may be metal strips or bands of solid copper core coated with pure Sn or a Sn solder alloy from a spool, stretch and cut the ribbon to size, form a strain relief feature and then place the ribbon over the second insulating layer with the correct orientation. The ribbon is then pressed into the conductive adhesive or solder paste filling the access openings. The solder paste may be melted or the adhesive cured by directly heating the ribbons with a hot bar or laser heating system. Alternatively the assembly may be heated by hot air, heated gas or infrared light to melt the solder and/or cure the adhesive. Pressure may be applied to the ribbons during the heating phase to ensure that solder or adhesive is pressed into the access openings in the insulating layer. If no solder paste or adhesive is used, then a solder coating on the ribbons may be used to make the connection. In this case, the ribbon is heated and pressed onto the insulating layer so that molten solder is pressed into the access openings of the second insulation layer. The present invention may apply any know or conceivable method for forming the ribbons as long as the method does not involve heating the solar module to temperatures above 300° C.

A typical method of forming the ribbon connection is to unroll a suitable length of ribbon, which i.e. may be metal strips or bands of solid copper core coated with pure Sn or a Sn solder alloy from a spool, stretch and cut the ribbon to size, form a strain relief feature and then place the ribbon over the second insulating layer with the correct orientation. The ribbon is then pressed into the conductive adhesive or solder paste in the access opening. The solder paste may be melted or the adhesive cured by directly heating the ribbons with a hot bar or laser heating system. Alternatively the assembly may be heated by hot air, heated gas or infrared light to melt the solder and/or cure the adhesive. Pressure may be applied to the ribbons during the heating phase to ensure that solder or adhesive is pressed into the access opening in the insulating layer. If no solder paste or adhesive is used, then a solder coating on the ribbons may be used to make the connection. In this case, the ribbon is heated and pressed onto the insulating layer so that molten solder is pressed into the access opening of the second insulation layer.

Alternatively, the ribbons may be formed by depositing a second metallic phase onto the second insulating layer which is patterned to define rectangular ribbons oriented more or less perpendicular to the underlying finger conductors. The deposition and patterning of the second metallic layer into the ribbons may be performed with the same methods as described above for the first metallic phase for formation of the finger conductors.

Any known or conceivable ribbon may be applied in the present invention. An advantageous and typically employed arrangement in a solar module is to connect the cells in electrical series circuit so that the emitter regions of one cell are connected to the base regions of the adjacent cell in the series circuit. The base region of the first cell in the series is connected to the positive output of the module and the emitter region of the final cell in the series is connected to the negative output of the module. This polarity is reversed when the cells have an N-type base region.

The example embodiment with the specific patterning of the access opening 17, 18 as shown in FIGS. 4 a)-c) and 5 allows forming the interconnections or ribbons of the solar module by simply depositing a second metallic phase onto the second insulating layer which is patterned to define rectangular ribbons oriented more or less perpendicular to the underlying finger conductors.

One example embodiment of the ribbons is rectangular ribbons of width as given in the above ranges and which are oriented at approximately 90 degrees in relation to the finger conductors, and aligned with openings in the insulating layer, such that each ribbon makes electrical contact with exclusively emitter- or base finger conductor regions on each cell. This principle is illustrated in FIG. 6, which shows the same example embodiment as shown in FIG. 5 after formation of ribbons with a regular rectangular cross-section. The ribbons 19 are formed on top of the second insulation layer 16, and are rectangular sheets/bands of the metal layer which are oriented approximately perpendicular to the orientation of the finger conductors 14 (compare with FIG. 3 b)). The figure shows the positions of the access opening 17, 18 to illustrate the serial connection. In reality the ribbons 19 will not be transparent such that the positions of the access opening 17, 18 will be invisible. This example embodiment enables a simple wafer based manufacturing process where all the wafer based process steps, i.e. the steps i) to vii) in step A) of the first aspect of the invention, are performed on the wafers before lamination. This provides the advantage of allowing employing higher temperatures if advantageous since there is no need for protecting the transparent adhesive from the heat, and it provides the advantage of forming the second insulation layer with the same patterning of the via conductors for every semi-finished solar of the multiplicity of solar cells in the module. The required serial connection of the cell interconnections may then be obtained by simply turn every second semi-finished solar cell in each row of the rectangular tessellated-resembling multiplicity 180° over the centre axis normal to its front side to arrive at the patterning of the via conductors shown in FIG. 5.

However, the invention is not tied to the example embodiment shown in FIGS. 4 a)-c), and 5. Any known or conceivable geometry and patterning of the ribbons and the underlying second insulation layer may be applied as long as it is compatible with the patterning of the access opening 17, 18. For example, the interconnection ribbons may have a constant rectangular cross section as is used in conventional silicon cell interconnection (shown in FIG. 6), or the ribbons may have non-constant cross-section and strain relief features incorporated. That is, the width of the ribbon need not be constant along the length of the ribbon, i.e. using an overall flattened rhombus shape for the ribbons such that the widest part of the ribbon is placed where the current flow is greatest, at the centre of the ribbon, and the narrowest part of the ribbon is at the edges where the current is smallest as. This achieves an optimized utilization of materials when the cross-section of the ribbon increases as the current increases to achieve a near constant resistive loss per unit length of the ribbon.

As a solar module is exposed to temperature cycles in normal operation, it is typical that there is some movement of individual cells relative to each other due to mismatched thermal expansion in the various components of the module (glass, encapsulation, silicon etc). The thermal expansion and contraction creates stress forces on the interconnection ribbons. To prevent this stress from causing a fracture in the module, ribbons may advantageously be bent or formed in such a way that the stress can be relieved by a small deformation in the ribbon at the bend or bends. The bends may be placed at one or more points along the ribbon, but are typically formed in the region where the ribbon spans the gap between adjacent cells.

When a solar module is exposed to the environment the cells in a solar module typically move with respect to each other by small amounts as a result of changes in ambient temperature and mismatched thermal expansion in the cover glass, encapsulant, backsheet and cells. It may thus be advantageous to apply a strain relief structure in the ribbon which is designed to enable axial expansion and contraction of the ribbon so that movement of the cells within the module does not stress or fracture the cell interconnects or ribbons. One example embodiment of strain relief structure in the ribbons is in the form of a Z-bend in the ribbon, which is formed out of the plane of the ribbon. An advantage of using the thinner ribbon geometries as in the present invention is that it is easier to form an in-plane strain relief structure in a thin ribbon by punching, laser cutting or other method. One possible in-plane strain relief structure is such that a straight line cannot be drawn from one end of the ribbon to the other without crossing one or more breaks in the continuous metal structure of the ribbon. Another possible in-plane strain relief structure is such that a straight line cannot be drawn between the mid-points of each end of the ribbon without crossing one or more breaks in the continuous metal structure of the ribbon.

Encapsulation

When the cell interconnects are formed, the final prosecution step is the encapsulation of the solar cells in-between the module front substrate and a module back substrate, This may advantageously be obtained by laminating a back-side substrate onto the second metal layer, i.e. the ribbons 19. The resulting structure of the solar module according to the above given example embodiment seen from the side is given schematically in FIG. 7 a) which shows a cross-section along line A-A and FIG. 7 b) which shows a cross-section along line B-B. The lamination adhesive may be the same as the transparent lamination adhesive 3, or any other known or conceivable lamination associated with solar modules, and the module back substrate 21 may be of any known or conceivable material associated with solar modules.

LIST OF FIGURES

FIG. 1 a) is a schematic drawing as seen from the side of an example embodiment of a silicon wafer having an interdigitated pattern of four emitter- and four base regions on the back-side.

FIG. 1 b) is a schematic drawing of the same embodiment shown in FIG. 1 a), but seen from above its back-side.

FIG. 2 a) is a schematic drawing as seen from the side of the same embodiment as shown in FIGS. 1 a) and b) after deposition of the amorphous silicon layer and the first patterned insulation layer.

FIG. 2 b) is a schematic drawing of the same embodiment shown in FIG. 2 a), but seen from above its back-side.

FIG. 3 a) is a schematic drawing as seen from the side of the same embodiment as shown in FIGS. 2 a) and b) after deposition and patterning of the first metallic phase to form the finger conductors.

FIG. 3 b) is a schematic drawing of the same embodiment shown in FIG. 3 a), but seen from above its back-side.

FIG. 4 a) is a schematic drawing as seen from the side of the same embodiment as shown in Figures a) and b) after deposition of the second insulation layer and formation of the access opening forming electric conductors through the second insulation layer. The figure shows a cross-section taken along the line A-A shown in FIG. 4 c).

FIG. 4 b) is a similar cross-section as FIG. 4 a), but now taken along line B-B shown in FIG. 4 c).

FIG. 4 c) is a schematic drawing of the same embodiment shown in FIGS. 4 a) and 4 b), but seen from above its back-side.

Figure 7:
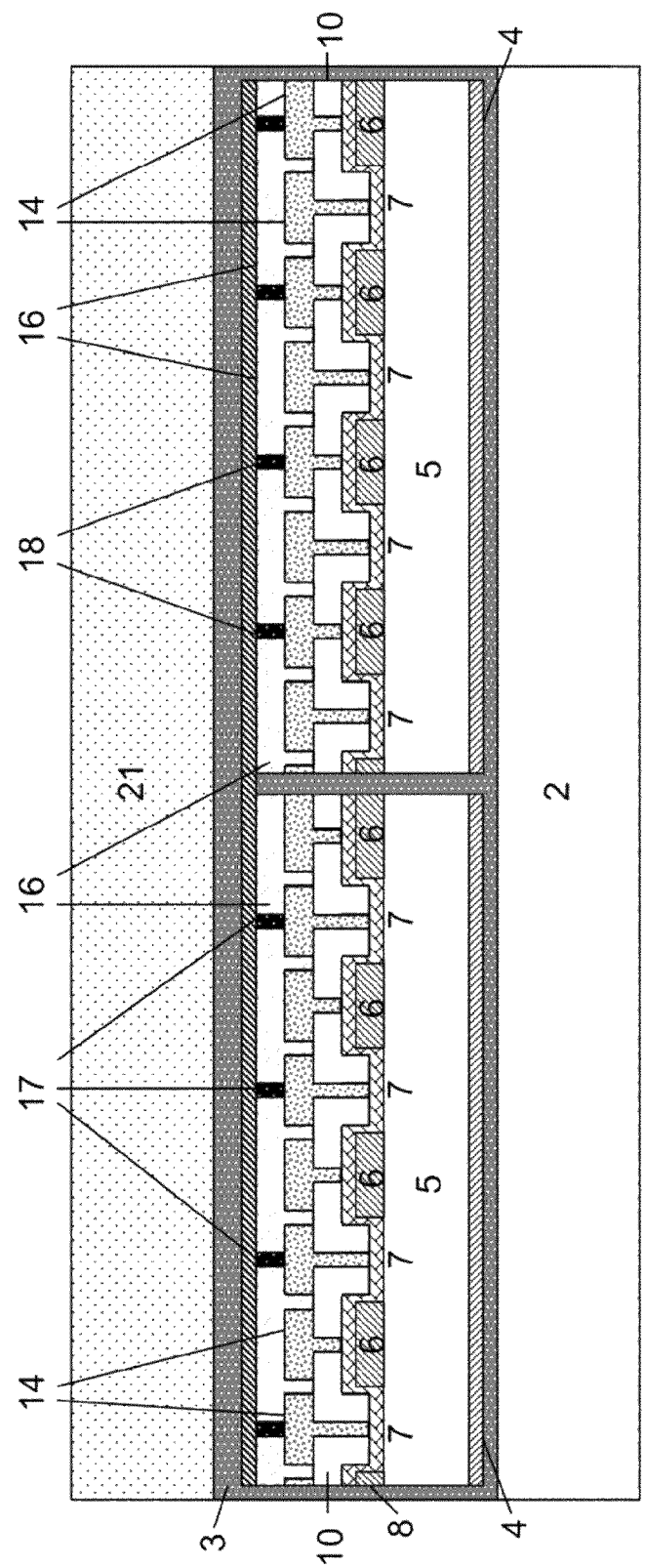
Figure 7:
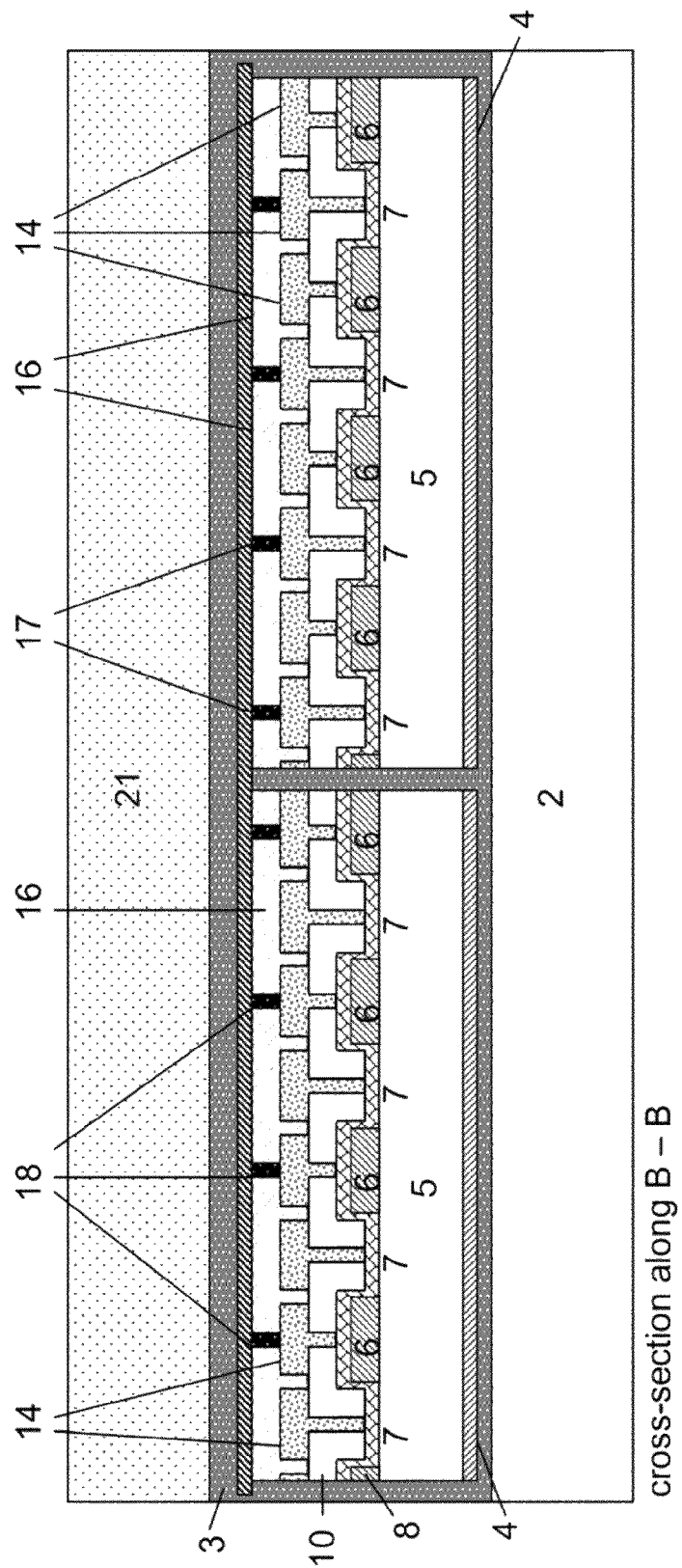

FIG. 7 a) is a schematic drawing as seen from the side of the same embodiment as shown in the previous figures, but now after encapsulation of the solar cells by lamination of a module back substrate. The figure shows a cross-section taken along line A-A shown in FIG. 5.

Figure 1:
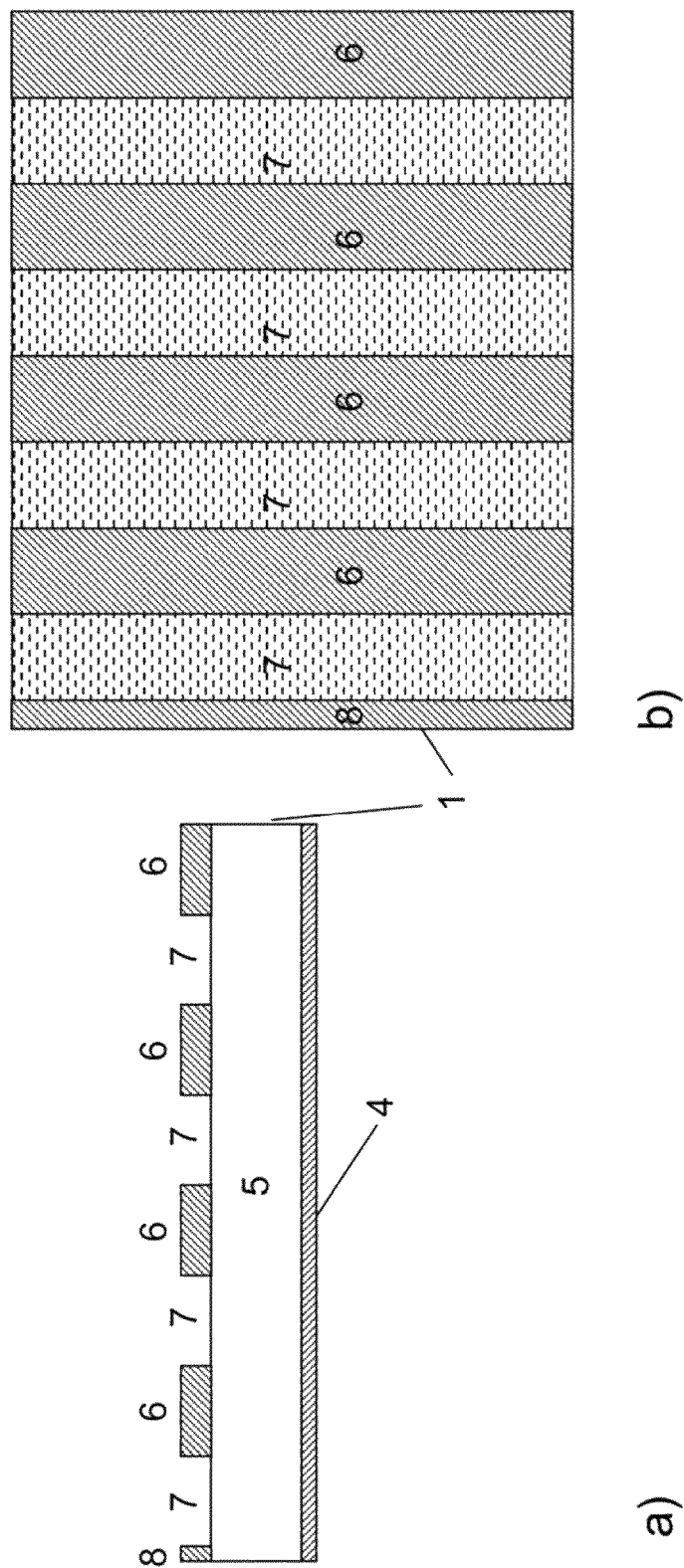
Figure 2:
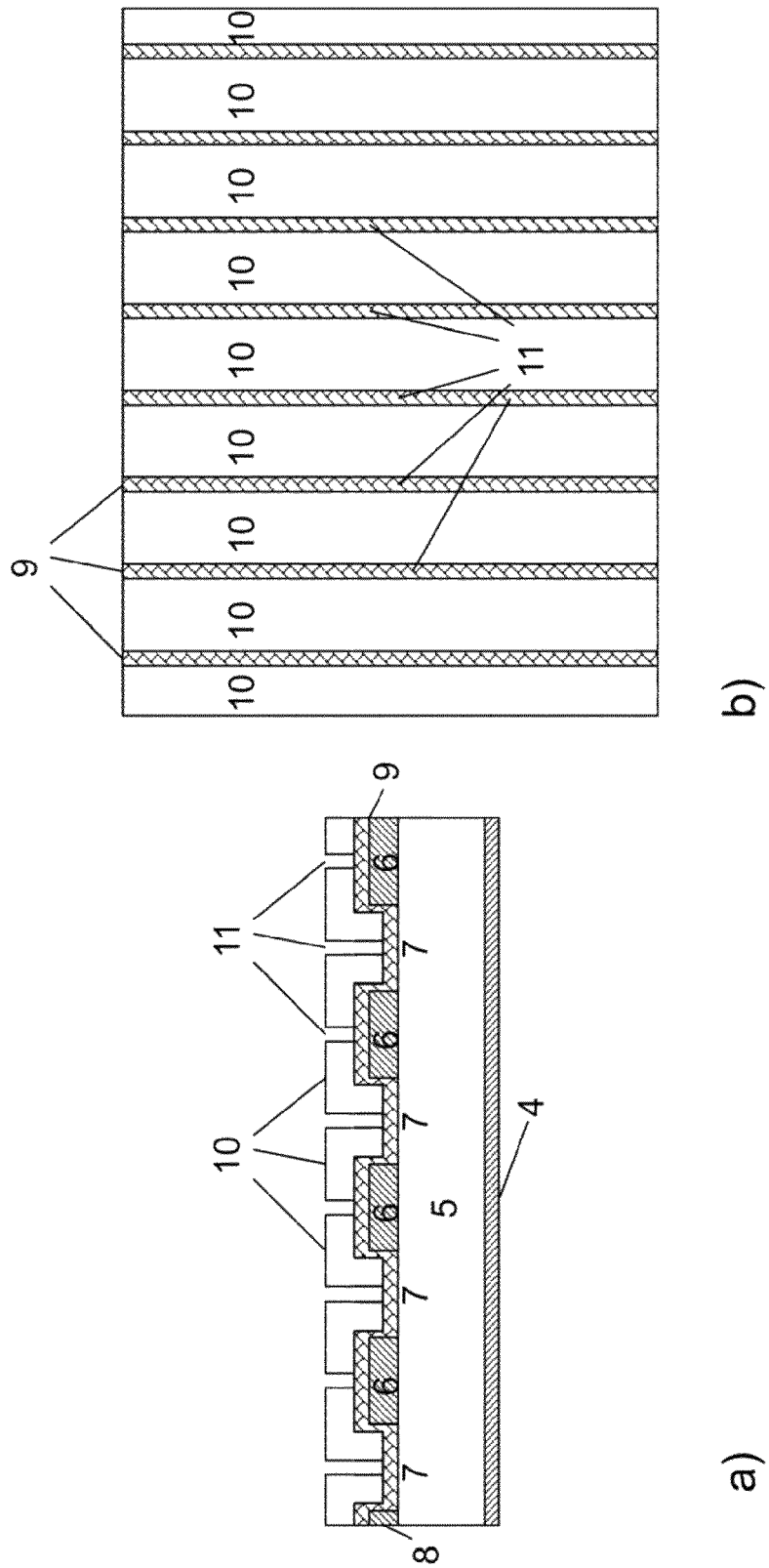
Figure 3:
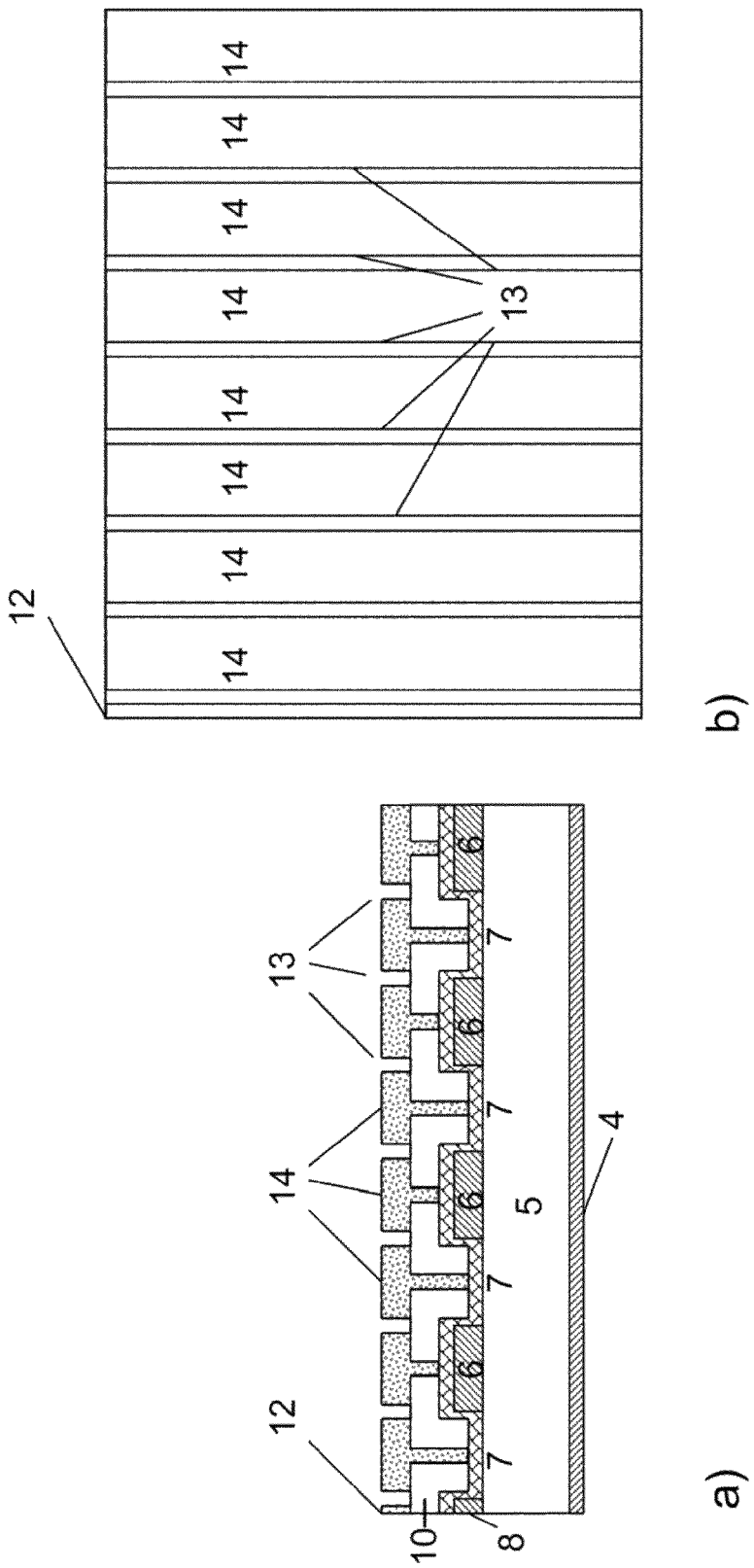
Figure 4:
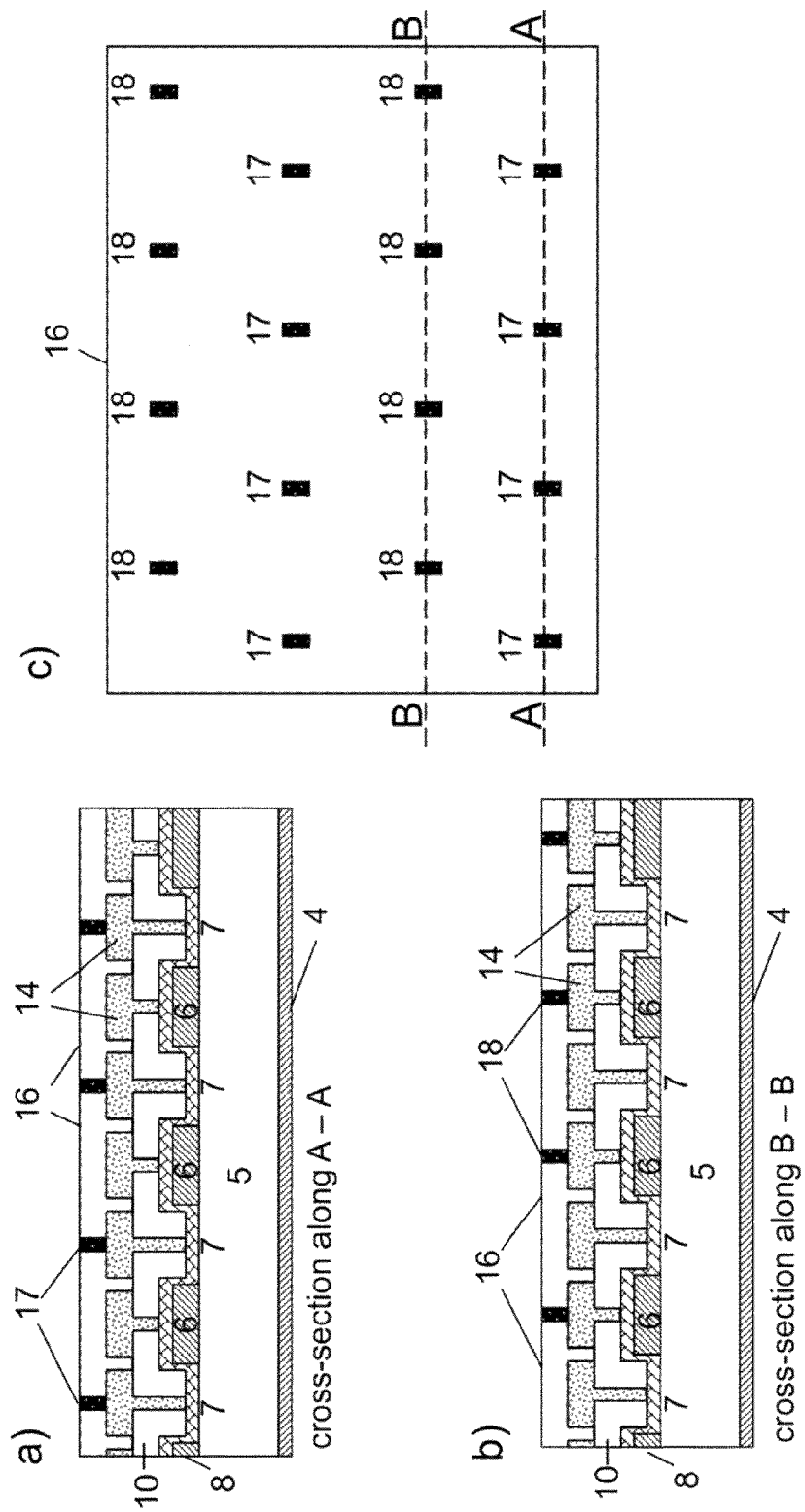
Figure 5:
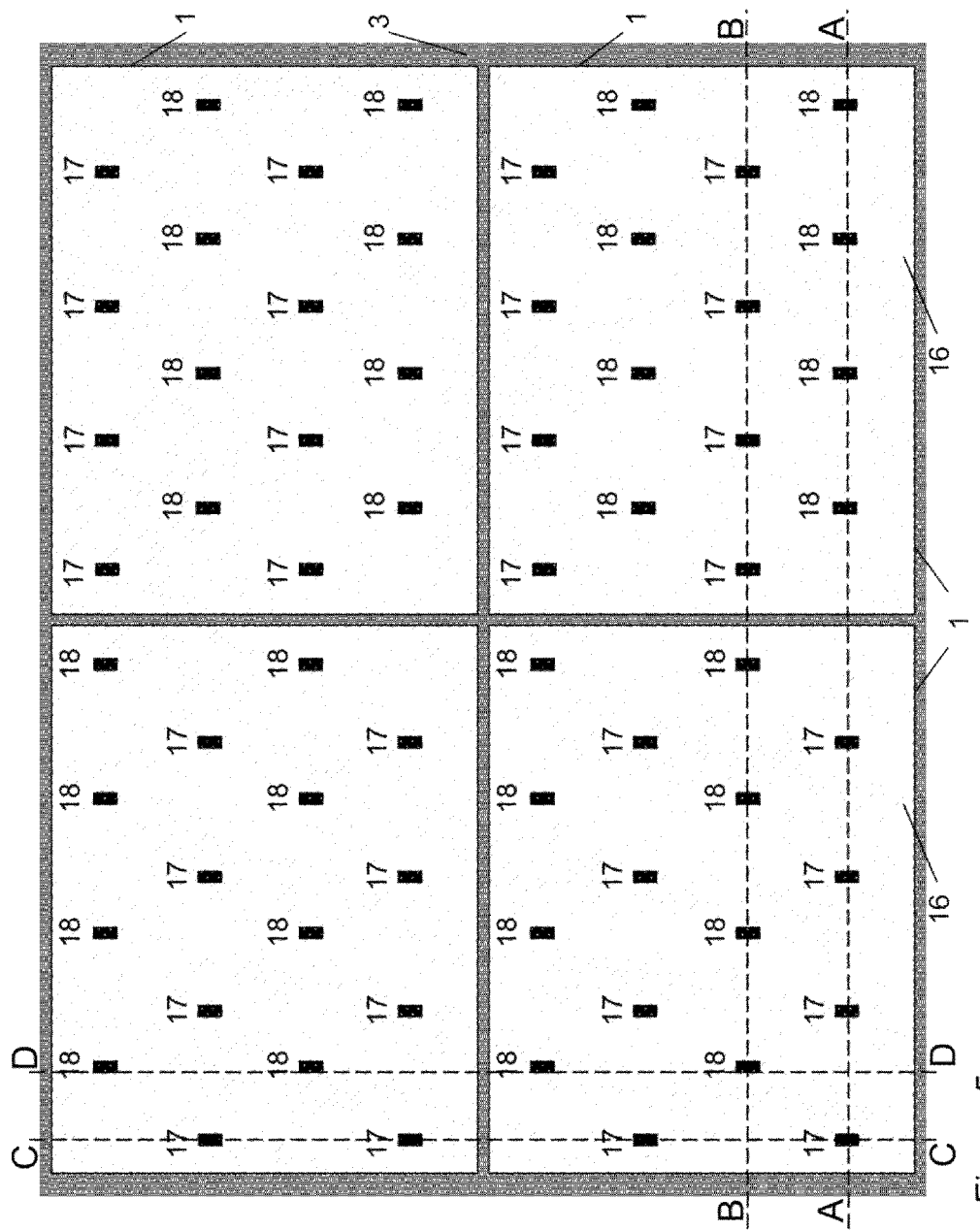
FIG. 5 is a schematic drawing of four semi-finished solar cells as shown in FIG. 4 c) laminated in a rectangular tessellated-resembling pattern onto a module front substrate, as seen from above its back-side.

FIG. 7 b) is a similar cross-section as FIG. 7 a), but now taken along line B-B shown in FIG. 5.

Figure 8:
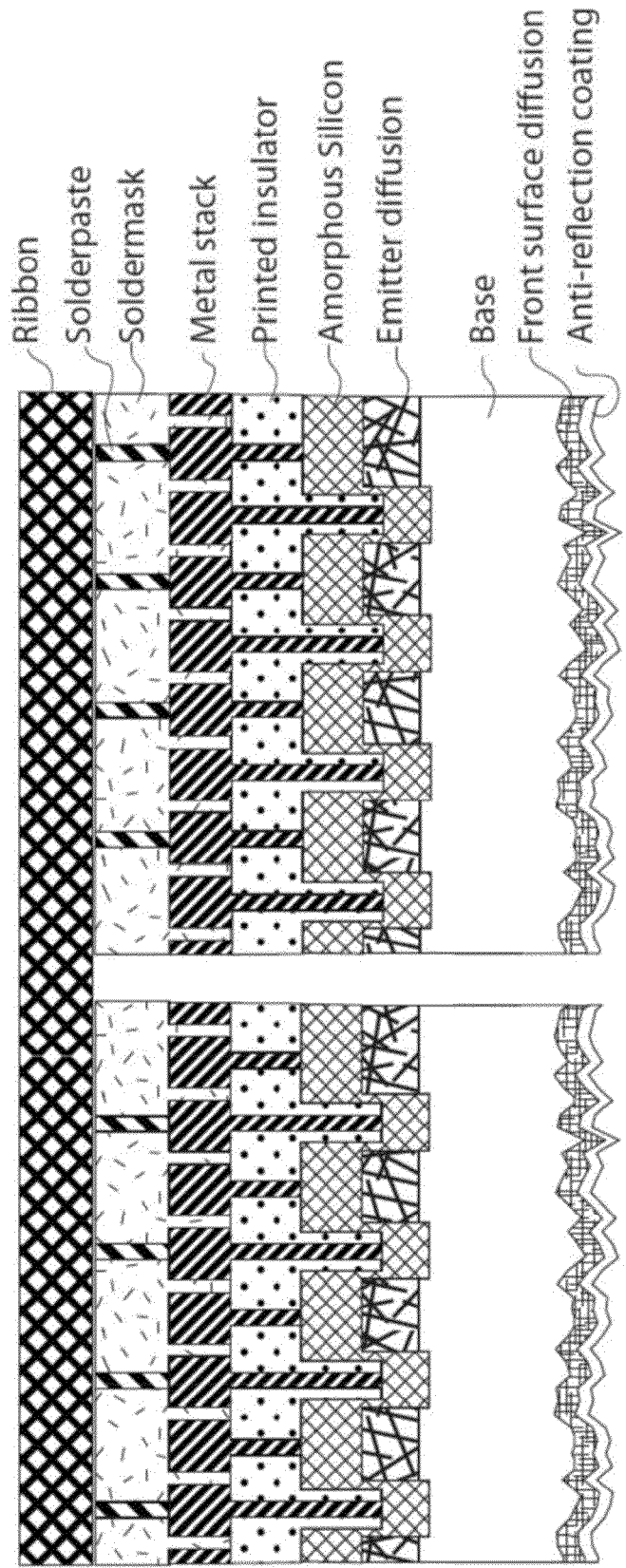
Figure 8:
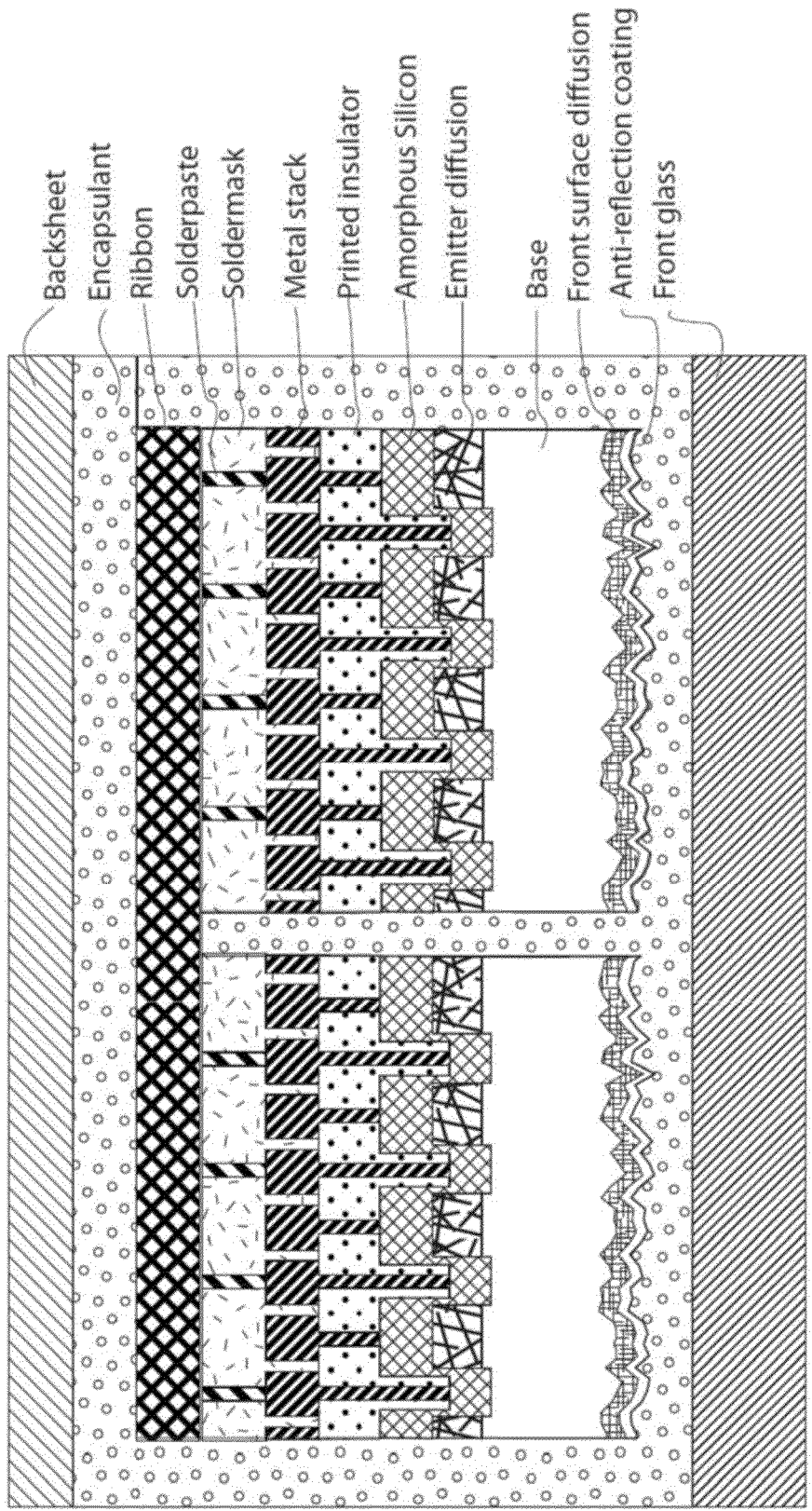
Figure 8:
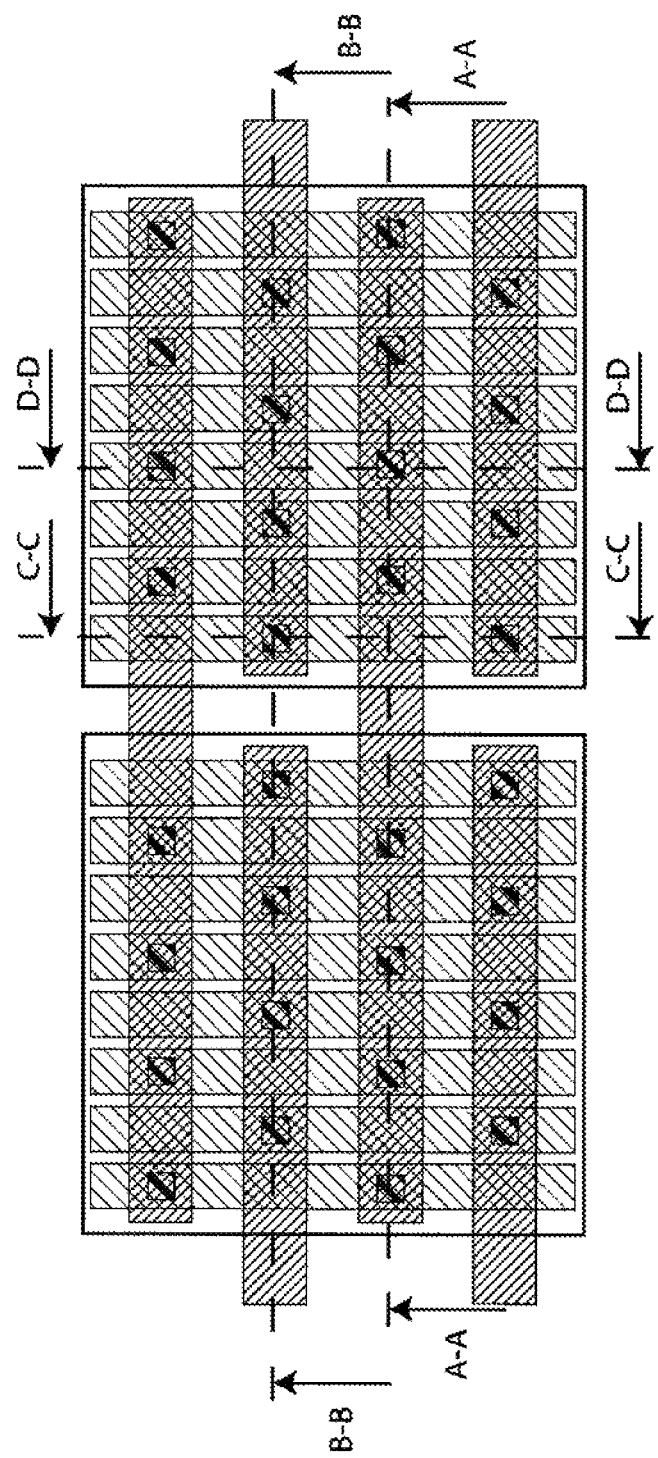

FIGS. 8 a)-n) are schematic drawings representing different stages of an example embodiment of a manufacturing process according to the present invention.

FIG. 9 a) is a schematic drawing seen from the side of a cross-section taken along line A-A in FIG. 8 n).

FIG. 9 b) is a schematic drawing seen from the side of a cross-section taken along line B-B in FIG. 8 n).

FIG. 9 c) is a schematic drawing seen from the side of a cross-section taken along line C-C in FIG. 8 n).

FIG. 9 d) is a schematic drawing seen from the side of a cross-section taken along line D-D in FIG. 8 n).

The figures are for the sake of clarity not drawn to scale. The actual ratio of the dimensions of the different structures of the solar modules may deviate considerably from the ratios indicated in the drawings.

EXAMPLE EMBODIMENTS OF THE INVENTION

The invention will be explained in greater detail by way of example embodiments. These examples are not to be interpreted as a limitation of the invention, the solar modules according to the invention may employ other configurations and numbers of solar cells as explained above.

First Example Embodiment

The first example embodiment employs a set of M solar cells laid out in a rectangular pattern of k columns and l rows, i.e. the number n of solar cells in the module becomes n=k·l. The example embodiment is illustrated with k=l=2, but may have any even number n of cells.

Each solar cell of the module is made from a quadratic silicon wafer of 125 mm in length and width, and which are laminated onto a front module front glass with a gap or relative distance between their respective side edges of approx. 0.2 mm. Each wafer is made by epitaxial growth of three monocrystalline silicon layers onto a porous release layer of a silicon donor wafer. The first epitaxially deposited layer is the emitter layer and is made to be 0.8 μm thick and doped to a concentration of $1 \cdot 10^{19}$ cm$^{-3}$ of phosphorous atoms (N-type doping), the second epitaxially deposited layer is the base layer and is made to be 40 μm thick and doped to a concentration of $3 \cdot 10^{16}$ cm$^{-3}$ of boron atoms (P-type doping), while the third epitaxially deposited layer is the front surface field layer and is made to be 1.5 μm thick and doped to a concentration of $5 \cdot 10^{17}$ cm$^{-3}$ of boron atoms (P-type doping element).

The epitaxial growth is obtained by RapidThermal CVD employing tetrachloro silane as precursor gas, admixed with appropriate amounts of diborane, $B_2H_6$, when depositing base or front surface field layers (which are being doped to P-type) or appropriate amounts of phosphine, $PH_3$, when depositing the emitter layer (which is being doped to N-type). The donor wafer was a rectangular monocrystalline silicon wafer with width and length of 126 mm and thickness of 500 μm. The deposition surface of the donor wafer was made into a release layer by forming a two-layered porous structure, where the uppermost layer has thickness of 0.7 μm and porosity of 25%, and the second layer had thickness of 0.3 μm and porosity of 45%, by conventional electro-chemical etching techniques.

The interdigitated multiplicity of the emitter- and base regions are formed by selective chemical etching by applying an etching mask and a chemical etching agent able to remove crystalline silicon in a per se known manner.

The free surface of epitaxially grown three-layered silicon wafers, i.e. the front surface of the front surface field, is surface passivated by plasma etching, such as i.e. reactive ion etching with $SF_6$ and $O_2$ as plasma gases. Then it is deposited a surface passivation film, i.e. a continuous layer of $\alpha$-$SiN_x$:H by chemical vapour deposition employing $SiH_4$ and $NH_3$ as precursor gases at 425° C. Optionally there may also be deposited an anti-reflective coating on top of the surface passivation layer. These operations are performed while the epitaxially grown wafers are attached to their donor wafer and the processing leads to the semi-finished solar cells which are released from their donor wafers by applying mechanical shear stress by use of a temporary chuck.

The next step is chemical vapour deposition of a 20 nm thick continuous $\alpha$-Si:H layer on the entire back-side of the module by heating the module to 175° C. in vacuum for about 30 minutes to out-gas the EVA and then immersing the module in a hydrofluoric acid solution (2.5% concentration) for 60 seconds until the surface appeared hydrophobic followed by rinsing in de-ionized water, drying and then loading the module into the amorphous silicon deposition chamber for immediate deposition of $\alpha$-Si:H.

The first insulation layer is made by depositing a 5 µm thick layer of a polyimide, and then cured at 180-200° C. The width of the linear contact areas is 50 µm—leading to an aspect ratio of contact area/finger conductor area of about 150. Then the exposed areas of the amorphous silicon layer, i.e. the contact access area are cleaned by plasma ashing in $O_2/N_2O$, and a hydrofluoric etching.

The metal layer intended to be the finger conductors are made by DC magnetron sputtering in a multi-chamber tool a 300 nm thick Al-layer as a semiconductor contact layer, followed by 50 nm of $Ni_{0.8}Cr_{0.2}$, and then followed by 50 nm of Cu using planar targets and Ar as a sputtering gas. The patterning of the metal layer is obtained by laser ablation forming linear grooves in the metal layer. The electric contact with the emitter- and base regions are then obtained by a gentle heat treatment up to a temperature of about 225° C. in order to crystallise the parts of the amorphous silicon layer lying in the contact access areas, i.e. in-between the silicon wafer and the Al-metal of the finger conductors.

The second insulation layer is made by screen printing an ultraviolet (UV) light curable solder mask of thickness 5 µm covering the entire back-side of the solar module. The screen printing is tuned to directly form the access openings 17, 18, which have rectangular cross-sections with length and width of 2 µm, and which are formed in the pattern described above and shown in the lower part of FIG. 7a. Here the solder mask with the holes for the access openings 17, 18 are shown separately for clarity.

The access openings 17, 18 are formed by stencil printing a solder paste followed by heat curing. Alternatively the access openings may be formed by needle dispensing a conductive adhesive, i.e. an adhesive polymer containing suspended metal particles followed by heat curing after the ribbons are deposited to attach the ribbons firmly.

The lamination of the semi-finished solar cells onto the module front glass may be performed after any of the above described process steps as soon as the front side of the wafers are processed to include a surface texturing, surface passivation and optionally an anti-reflective coating. The eventual remaining process steps on the back side of the wafers will then necessarily be employed on the laminated multiplicity of solar cells. The lamination is obtained by depositing four semi-finished solar cells in the 2×2 pattern described above with their back surfaces down onto a lamination board, and then pressing the module front glass which has a 150-300 µm thick layer of ethylene-vinyl acetate (EVA) facing the semi-finished solar cells and heating the assembly to about 175° C. until the EVA is cured. Then the front module glass including the laminated semi-finished solar cells is separated from the lamination board, and the remains of the porous release layer is removed from all semi-finished solar cells by chemical etching in aqueous potassium hydroxide solutions.

Figure 6:
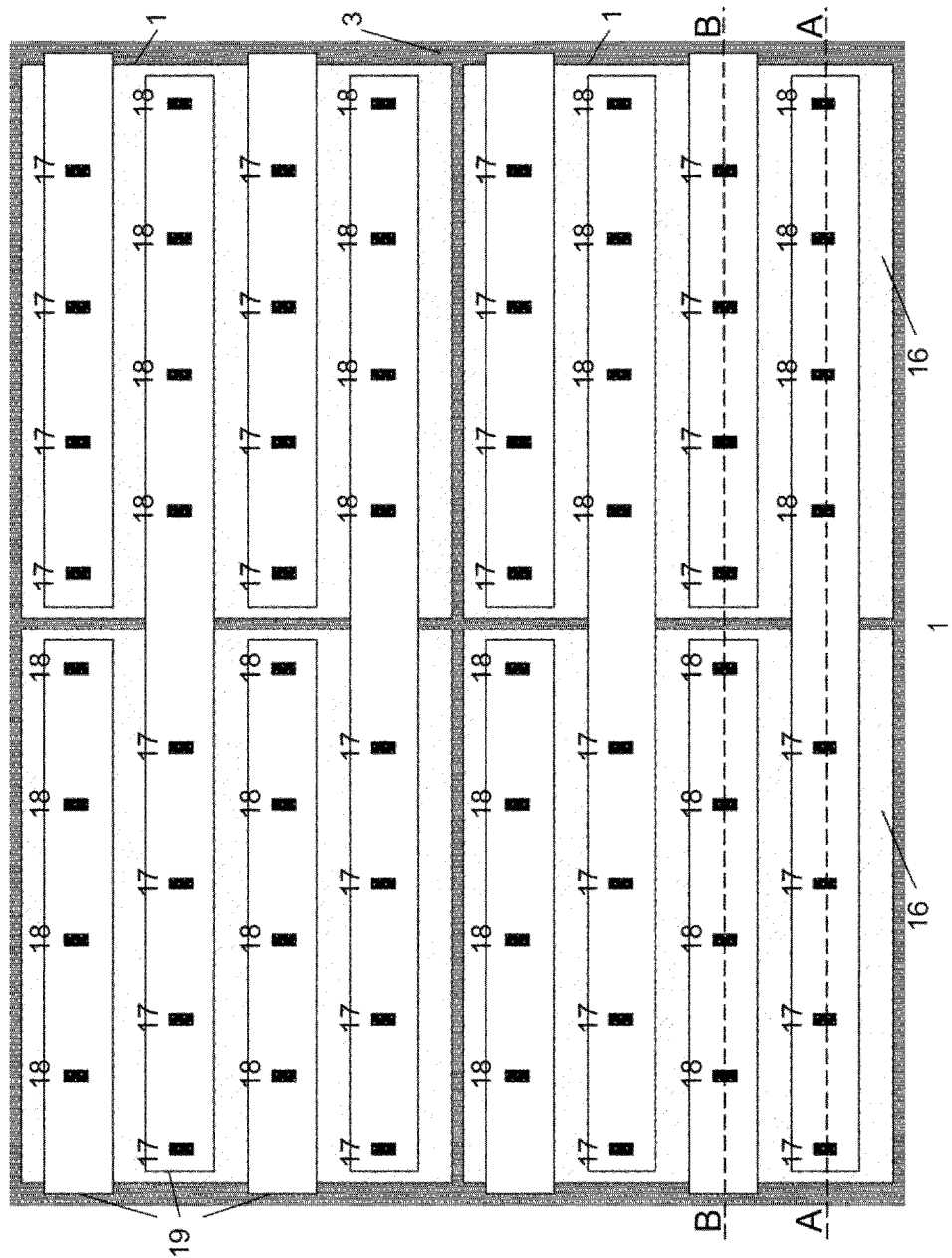
FIG. 6 is a schematic drawing of an example embodiment as shown in FIG. 5 after formation of the cell interconnects or ribbons.

The first example embodiment is given a ribbon geometry as illustrated in FIG. 6, which in the upper part shows two arbitrarily chosen solar cells 1 number n and n+1 in one row of the solar module. For the cause of clarity the other solar cells 1 in this row (nor in the other rows) are not shown on the figure, and all details related to the solar module are omitted. The Figure does however indicate the underlying finger conductors 14 of the solar cells by the rectangles drawn with a dotted line, and the access openings 17, 18 are shown as dark squares.

The ribbons 20, 21 of this example embodiment are all rectangular with a constant cross-section and made to span across two sideways adjacent cells in the row, with an exception for the ribbons obtaining contact with either the emitter regions or the base regions of the first or last solar cell in each row. These ribbons will only span one cell. The figure illustrates the span across two cells by showing the full length of the ribbons marked with reference number 21, but only indicates the two-cell span of the other ribbons 20 of solar cell n as truncated and extending towards cell n−1 (not shown), and similarly, the ribbons 20 of solar cell n+1 extends to the right of the solar cell n+1. However, if solar cell n+1 is not the last solar cell of the row, there will be a solar cell n+2 (not shown) to the right of cell n+1, of which the ribbons 20 will span across and be connected to the finger conductors of the opposed polarity of the finger conductors at which it is connected to of the previous cell.

Each ribbon 20, 21 is made of a 50 µm thick metal strip of solid copper core coated with pure Sn having a length of 250 mm and width of 6 mm. For the first and last solar cell of each row of the solar module, every second ribbon (either 20 or 21) will have length 125 mm. In the regions between two adjacent solar cells the ribbons 20, 21 may advantageously have strain relief sections 22 in order to take up movements due to thermal expansion in the solar module resulting from temperature cycles during normal operation. The strain relief section 22 of this embodiment example is a Z-shaped bend (not shown).

Second Example Embodiment

The second example embodiment is a variant of the first example embodiment including the following steps:
1. Texturing the front side followed by diffusion with dopant and formation of an anti-reflection coating to front side of wafer. The front surface is optionally diffused or implanted to form a front surface field or floating junction. Front and back diffusions may be of the same type to achieve a floating junction at the front of the cell, or different types such that a p-n junction is formed at the back side of the cell and a front surface field is formed at the front of the cell. The resulting structure is shown in FIG. 8 a).
2. Selectively removing regions of the rear-surface emitter by either:
    2.1 a) Coating back side of wafers with etch resist (for example Novolac resin), or optionally screen printing patterned resin and skip inkjet (FIG. 8 b).
       b) Patterning resist using basic solution (inkjet print), optionally screen printing basic solution to pattern resist (FIG. 8 c).

c) Etching exposed silicon areas to remove emitter (FIG. 8 *d*).
d) Removing resist (FIG. 8 *e*).

Or 2.2 Screen- or stencil printing a silicon etching paste.

Or 2.3 Selectively removing emitter regions by laser ablation.

3. Depositing 1-20 nm of amorphous silicon with optional $SiO_2$ or $SiN_x$ covering layer to form contact/passivation layer (FIG. 8 *f*).
4. Screen printing patterned first insulator material (polyimide) (FIG. 8 *g*).
5. Low temperature bake of polyimide<300° C.
6. Optionally plasma ashing in $O_2/N_2O$ to clean contact surface, or optionally HF etching to remove native oxide or $SiO_2/SiN_x$ covering layer.
7. Depositing metal stack, All NiCr/Cu<20 μm thick (FIG. 8 *h*). Similar metallizations such as AlSi/NiV/SnCu may also be used, where the Al containing alloy is in contact with the silicon. The metal may be deposited as a continuous film and subsequently patterned through means of laser ablation, mechanical scribing or other means. Alternatively, a sacrificial lift-off material such as wax, or polymer may be deposited onto the cell back surface prior to metal deposition to enable selective removal of the metal overlying the lift-off material. Alternatively, a mechanical shadow mask may be paced on the cell prior to deposition to allow patterned deposition of metal onto the back surface of the cell.
8. Metal patterning by laser ablation (FIG. 8 *i*).
9. Contact annealing <250° C. to activate low-resistance Al—Si contact to emitter and base regions.
10. Screen printing/stencil printing patterned soldermask insulator (FIG. 8 *j*).
11. Stencil printing solder paste (FIG. 8 *k*).
12. Placing interconnector ribbons over module. (FIG. 8 *l* or 8 *n*).
13. Hot air gun, laser or oven to melt solder.
14. Solder cross-connector, laminate back-sheet (FIG. 8 *m*), alternate views in (FIGS. 9 and 10), for indication of lines A-A to D-D, see FIG. 8 *n*).
15. Junction box and framing.

REFERENCES

1. Keevers et. al, "10% Efficient CSG Minimodules", 22*nd European Photovoltaic Solar Energy Conference*, Milan, September 2007
2. Beaucarne et al., "Etching, texturing and surface decoupling for the next generation of Si solar cells", *Photovoltaics International*, PV101-103, 2008.
3. Le Quang et al., "Dry Plasma Texturing—An Alternative Technique for Industrial Production of Thin me-Si Solar Cells", paper presented at 22nd European PV SEC, 3-7 Sep. 2007 in Milan, Italy.
4. Kumaravelu et al. "Surface Texturing for Silicon Cells Using Reactive Ion Etching", Photovoltaic Specialists Conference, 2002. Conference Record of the Twenty-Ninth IEEE, 19-24 May 2002.

The invention claimed is:

1. A method for manufacturing a back-contacted back-junction silicon solar cell module having a front side and a back side, the method comprising a set of module process steps A) to D) which are performed in successive order, the set of module process steps A) to D) comprising the steps of:
  A) forming a multiplicity of semi-finished solar cells by repeatedly performing steps i) and ii) from a set of wafer process steps in successive order until the multiplicity is formed, wherein the steps i) and ii) of the set of wafer process steps are:
    i) employing a crystalline silicon wafer having a back side and a front side and a layered stratified doped structure at least containing a back-side emitter layer and a base layer below the emitter layer, and where the wafer has a multiplicity of alternating rectangular emitter and base regions on the back side; and
    ii) forming a texturing and depositing at least one surface passivation film on the front side of the wafer;
  B) laminating the multiplicity of semi-finished solar cells from module process step A) to a module front substrate, wherein each semi-finished solar cell is laid with their front-side facing the module front substrate in a rectangular tessellated-resembling pattern, and then performing steps iii) to vii) from the set of wafer process steps in successive order on the laminated multiplicity of semi-finished solar cells, wherein the steps iii) to vii) of the set of wafer process steps are:
    iii) forming a back side surface passivation layer by depositing a continuous amorphous silicon layer covering the back side, in its entirety, of the wafer;
    iv) forming a first insulation layer onto the back side surface passivation layer with linear openings defining electric contact access areas running in parallel and located directly above each of the multiplicity of alternating rectangular emitter and base regions;
    v) forming rectangular metallic electric finger conductors, each of the rectangular metallic electric finger conductors being in parallel with and directly above each of the multiplicity of alternating rectangular emitter and base regions;
    vi) forming a second insulation layer onto each rectangular metallic electric finger conductor with a set of access openings at positions where electric contact with the rectangular metallic electric finger conductor is intended; and
    vii) forming a via contact in each access opening in the second insulation layer in electric contact with the rectangular metallic electric finger conductor lying below the access opening, and then
  C) forming functional solar cells of the semi-finished solar cells by forming a set of ribbon contacts on top of the second insulation layer with a set of access openings for interconnection of the semi-finished solar cells of the module, and
  D) laminating a back-side cover substrate onto the back-side of the module front substrate including the multiplicity of solar cells.

2. The method according to claim 1, wherein the semi-finished solar cells are laminated onto the module front substrate to form an assembly by depositing all semi-finished solar cells of the solar module in the rectangular tessellated-resembling pattern onto a lamination board, where each semi-finished solar cells is laid with their back-surfaces facing down onto the lamination board, followed by pressing the module front glass which has a less than 1 mm thick layer of ethylene-vinyl acetate (EVA) facing the semi-finished solar cells and heating the assembly to about 175° C. until the EVA is cured.

3. The method according to claim 2, wherein the continuous amorphous silicon layer is formed by loading the module into an amorphous silicon deposition chamber for deposition of 1-50 nm thick layer of α-Si by chemical vapour deposition (CVD).

4. The method according to claim 3, wherein a continuous layer of $SiN_x$ is deposited onto the continuous amorphous silicon layer by chemical vapour deposition.

5. The method according to claim 1, wherein the first and second insulation layers are made by screen printing a polyimide composition to form a patterned layer of thickness of 1-10 μm having linear contact areas with a width in a range from 50-200 μm running in parallel and aligned above the centre of each P- and N-type region of the multiplicity of alternating rectangular emitter and base regions and then cured at 180-200° C.

6. The method according to claim 1, wherein the electric contact access areas are cleaned by plasma ashing in $O_2$ or $N_2O$, and a hydrofluoric etching after formation of the first insulation layer.

7. The method according to claim 1, wherein the rectangular metallic electric finger conductors are formed by forming a continuous metallic phase being deposited by plasma vapour deposition (PVD) until the continuous metallic phase on the back-side of the wafer has a thickness be in one of the following ranges; from 200 nm to 20 μm, from 200 nm to 10 μm, from 300 nm to 5 μm, from 300 nm to 2 μm, from 350 nm to 1 μm, or from 350 nm to 800 nm.

8. The method according to claim 7, wherein the continuous metallic phase is a stack of metal layers chosen among the following: Al/NiCr/Cu, Al/NiCr/SnCu, or AlSi/NiV/SnCu, where the Al or Al-containing alloy is made to be in contact with the amorphous silicon layer.

9. The method according to claim 8, wherein the stack of metal layers also contains an upper contact layer on a side opposite of an adhesion layer, the upper contact layer being chosen among one of the following; Cu, Sn and Ag containing alloys; a Cu—Sn—Ag containing alloy; a Cu—Sn alloy; Sn; or Au, Ag or Pd.

10. The method according to claim 7, wherein the rectangular metallic electric finger conductors are made by:
   DC magnetron sputtering in a multi-chamber tool a continuous Al-layer as a contact layer, followed by a continuous layer of $Ni_{0.8}Cr_{0.2}$, and then a continuous layer of Cu using planar targets and Ar as a sputtering gas, and
   patterning the DC magnetron sputtered continuous Al, $Ni_{0.8}Cr_{0.2}$ and Cu layers by laser ablation forming linear grooves in the Al, $Ni_{0.8}Cr_{0.2}$ and Cu layers.

11. The method according to claim 1, wherein the second insulation layer is formed by one of:
   applying a patterned adhesive or a printable insulating ink onto the rectangular metallic electric finger conductors of the wafer,
   depositing an un-patterned continuous second insulation layer, and using a subsequent patterned print of conductive material to selectively etch through, penetrate, melt or dissolve the second insulation layer in selected regions, or
   printing via conductor pads directly onto the rectangular metallic electric finger conductors, and then flowing a self-levelling insulator layer around the conductor pads to form the second insulating layer by UV curing.

12. The method according to claim 1, wherein the ribbons formed by applying a suitable length of metal strip or band from a spool, stretch and cut the metal strip or band to size, form a strain relief feature and then place the metal strip or band over the second insulating layer, and then pressing the metal strip or band into a conductive adhesive or solder paste in the set of access openings.

13. The method according to claim 12, wherein the metal strip has a constant cross-section and is made of solid copper core coated with pure Sn of thickness in a range selected from one of from 10 to 300 μm, from 20 to 200 μm, from 30 to 100 μm, from 30 to 60 μm, or from 35 to 50 μm, and width in one of the following ranges; from 0.1 to 20 mm, from 0.3 to 15 mm, from 0.5 to 10 mm, from 1 to 8 mm, or from 3 to 6 mm, and where
   each ribbon is oriented and located such that is parallel and aligned with either an even or an odd numbered row of the rectangular pattern of m·n access points of the semi-finished solar cells, and
   is spanning across two solar cells in a same row of the multiplicity of M=k·l semi-finished solar cells of the solar module such that:
   ribbons aligned with an odd numbered row of the rectangular pattern of m·n access points of an odd numbered semi-finished solar cell will connect the emitter type regions of this odd number semi-finished solar cell with the base type regions of a next semi-finished solar cell in the row, and
   ribbons aligned with an even numbered row of the rectangular pattern of m·n access points of an odd numbered semi-finished solar cell will connect the emitter type regions of this odd numbered semi-finished solar cell with the base type regions of a previous semi-finished solar cell in the row, and
   wherein:
   if the semi-finished solar cell is the first semi-finished solar cell in the row, the ribbons aligned with even numbered rows do only span across this semi-finished solar cell, or
   if the semi-finished solar cell is the last semi-finished solar cell in the row, the ribbons aligned with odd numbered rows do only span across this semi-finished solar cell.

14. The method according to claim 1, wherein the ribbons is formed by applying a suitable length of metal strip or band from a spool, stretch and cut the metal strip or band to size, form a strain relief feature and then place the metal strip or band over the second insulating layer, and then pressing the metal strip or band into a conductive adhesive or solder paste in the set of access opening.

15. The method according claim 2, wherein the first and second insulation layers are made by screen printing a polyimide composition to form a patterned layer of thickness of 1-10 μm having linear contact areas with a width in a range from 50-200 μm running in parallel and aligned above the centre of each P- and N-type region of the multiplicity of alternating rectangular emitter and base regions and then cured at 180-200° C.

16. The method according claim 3, wherein the first and second insulation layers are made by screen printing a polyimide composition to form a patterned layer of thickness of 1-10 μm having linear contact areas with a width in a range from 50-200 μm running in parallel and aligned above the centre of each P- and N-type region of the multiplicity of alternating rectangular emitter and base regions and then cured at 180-200° C.

17. The method according to claim 4, wherein the first and second insulation layers are made by screen printing a polyimide composition to form a patterned layer of thickness of 1-10 μm having linear contact areas with a width of a range from 50-200 μM running in parallel and aligned above the centre of each P- and N-type region of the multiplicity of alternating rectangular emitter and base regions and then cured at 180-200° C.

18. The method according claim 2, wherein the electric contact access areas are cleaned by plasma ashing in $O_2$ or $N_2O$, and a hydrofluoric etching after formation of the first insulation layer.

19. The method according claim 3, wherein the electric contact access areas are cleaned by plasma ashing in $O_2$ or $N_2O$, and a hydrofluoric etching after formation of the first insulation layer.

20. The method according claim 1, wherein metallization for the entire module is performed after depositing the solar cells on the module front substrate.

* * * * *